(12) United States Patent
Tanaka et al.

(10) Patent No.: US 8,168,940 B2
(45) Date of Patent: May 1, 2012

(54) OPTICAL TRANSMISSION MODULE, ELECTRONIC DEVICE AND METHOD FOR MANUFACTURING OPTICAL TRANSMISSION MODULE

(75) Inventors: Junichi Tanaka, Nara (JP); Hiroshi Sameshima, Nara (JP); Naru Yasuda, Uji (JP)

(73) Assignee: OMRON Corporation, Kyoto (JP)

( * ) Notice: Subject to any disclaimer, the term of this patent is extended or adjusted under 35 U.S.C. 154(b) by 304 days.

(21) Appl. No.: 12/674,256

(22) PCT Filed: Dec. 24, 2008

(86) PCT No.: PCT/JP2008/073452
§ 371 (c)(1),
(2), (4) Date: Feb. 19, 2010

(87) PCT Pub. No.: WO2009/090842
PCT Pub. Date: Jul. 23, 2009

(65) Prior Publication Data
US 2011/0186717 A1    Aug. 4, 2011

(30) Foreign Application Priority Data
Jan. 15, 2008    (JP) .................................. 2008-006159

(51) Int. Cl.
*G02B 6/42*    (2006.01)
(52) U.S. Cl. ......... 250/227.28; 250/227.24; 250/227.31; 385/88; 385/100; 385/130
(58) Field of Classification Search ............. 250/227.11, 250/227.24, 227.28, 227.29, 227.31; 385/12, 385/40, 88, 92, 100, 130; 398/141, 142
See application file for complete search history.

(56) References Cited

U.S. PATENT DOCUMENTS

| 7,382,960 B2 * | 6/2008 | Ohtsu et al. .................... 385/130 |
| 2010/0221016 A1 * | 9/2010 | Tanaka et al. ................. 398/138 |

FOREIGN PATENT DOCUMENTS

| JP | 3-184006 A | 8/1991 |
| JP | 10-294493 A | 11/1998 |
| JP | 3257776 B2 | 12/2001 |
| JP | 2005-321560 A | 11/2005 |
| JP | 2006-259682 A | 9/2006 |
| JP | 2008-090218 A | 4/2008 |

OTHER PUBLICATIONS

International Search Report issued in PCT/JP2008/073452, mailed on Jan. 27, 2009, with translation, 3 pages.
Written Opinion issued in PCT/JP2008/073452, mailed on Jan. 27, 2009, 4 pages.
Patent Abstracts of Japan, Publication No. 2000-214351, dated Aug. 4, 2000 (corresponds to JP3257776 B2 cited herein), 1 page.

\* cited by examiner

*Primary Examiner* — Kevin Pyo
(74) *Attorney, Agent, or Firm* — Osha • Liang LLP

(57) ABSTRACT

A light transmission module includes a light transmission path for transmitting light, an optical element including a light emitting and receiving surface for optically coupling with the light transmitted by the light transmission path, and being formed with a light emitting and receiving point having a function of photoelectric conversion and an electrode pad on the light emitting and receiving surface. The light transmission module further includes a substrate mounted with the optical element and an electrical wiring and an electrical connecting member for electrically connecting the electrode pad and the electrical wiring. The substrate includes a wiring exposed surface where the electrical wiring is exposed. The electrical connecting member is made of solidified object of a liquid conductive material arranged to contact the electrical wiring, which is exposed at the wiring exposed surface, and the electrode pad.

16 Claims, 17 Drawing Sheets

OPTICAL TRANSMISSION MODULE, ELECTRONIC DEVICE AND METHOD FOR MANUFACTURING OPTICAL TRANSMISSION MODULE

TECHNICAL FIELD

The present invention relates to a light transmission module for transmitting an optical signal, an electronic device, and a manufacturing method of the light transmission module.

BACKGROUND ART

In recent years, optical communication network enabling large capacity data communication at high speed is expanding. The optical communication network is assumed to be mounted on a commercial-off-the-shelf device in the future. An electrical input/output optical data transmission cable (optical cable) capable of being used no different from the present electrical cable is desired for the application of large capacity data transfer at higher speed, noise countermeasures, and data transmission between substrates in the device. In view of flexibility, a film light guide is desirably used for the optical cable.

The light guide is formed by a core having a large index of refraction and a clad having a small index of refraction arranged contacting the periphery of the core, and propagates the optical signal entered to the core while repeating total-reflection at the boundary of the core and the clad. The film light guide has flexibility since the core and the clad are made of a flexible polymer material.

The light transmission module using the film light guide having flexibility for the optical cable generally includes the following members. In other words, the light transmission module includes a photoelectric conversion element (light emitting and receiving element) that optically couples with the light guide, a substrate including an electrical wiring to be connected to the photoelectric conversion element, and electrical connecting means for electrically connecting the electrical wiring and the photoelectric conversion element. The light emitting and receiving element is an element having a function of converting the electric signal to the optical signal and emitting the same, and receiving the optical signal and converting to the electric signal. In the conventional light transmission module, a wire bonding is used for the electrical connecting means for electrically connecting the electrical wiring and the photoelectric conversion element (e.g., patent document 1).

FIG. 18(a) is a perspective view of the conventional light guide module 201, FIG. 18(b) is a side cross-sectional view thereof, and FIG. 18(c) is a perspective view of an air tightly packaged light guide module 201.

As shown in such figures, a light guide film 210 is mounted on a sub-mount 220, and transmission of light is carried out with a light emitting and receiving element 230 through mirror surface reflection at the end face. The sub-mount 220 for mounting the light guide film 210 is formed in an IC package 240. The IC package 240 is formed with an electrode 242, which electrode 242 is electrically connected to a light emitting and receiving point 232 of the light emitting and receiving element 230 by a wiring 246. In other words, the electrode 242 and the light emitting and receiving point 232 are electrically connected through wire bonding by the wiring 246.

Another example of a configuration of the light transmission module includes a light transmission module disclosed in patent documents 2 and 3.

As shown in FIG. 19, the light transmission module disclosed in patent document 2 has a configuration in which a film optical wiring 311 and an optical device 314 are adhered by a bump 310.

Patent document 3 discloses a technique for determining the positions of the optical element and the light guide by a positioning pin formed in the substrate.

For instance, miniaturization and lower height of the light transmission module are assumed to be required when using the light guide in the small and thin device. However, in the conventional light transmission module shown in FIG. 18, a space for wire bonding needs to be ensured, and thus there is a limit to lowering height.

In other words, as shown in FIGS. 18(a) to 18(c), the wiring 246 has a loop structure since a high and low difference is created between the forming surface of the light emitting and receiving point 232 and the forming surface of the electrode 242 when electrically connecting the wiring 246 and the light emitting and receiving point 232 by wire bonding. Thus, in the conventional light transmission module, a design that ensures the loop height of the wiring 246 (distance between the forming surface of the light emitting and receiving point 232 and the vertex of the loop structure of the wiring 246) is made. Therefore, setting the optical coupling distance L (distance between the light emitting and receiving point 232 and the light guide film 210) to smaller than or equal to the loop height of the wiring 246 becomes difficult when mounting the light guide film 210 on the sub-mount 220, and thus there is a limit to lowering the height of the light transmission module.

The light transmission module using the film light guide for the optical cable converts the electric signal to the optical signal and emits the same, and receives the optical signal and converts to the electric signal in the photoelectric conversion element (light emitting and receiving element). Thus, compared to the signal transmission module using a normal electrical wiring, the light transmission module consumes extra power in optical—electric conversion or electric—optical conversion in the photoelectric conversion element, and hence the power consumption increases.

Furthermore, the light quantity of the light exit from the light emitting element towards the film light guide needs to be increased to ensure the light quantity that enters from the film light guide to the light receiving element the greater the optical coupling distance in the light transmission module, and hence the power (power consumption) necessary in the light emitting and receiving element increases. In the conventional light transmission module shown in FIGS. 18(a) to 18(c), setting the optical coupling distance L to smaller than or equal to the loop height of the wiring 246 is difficult, and thus reduction of the power consumption by reduction of the optical coupling distance L is also limited.

If the light guide film 210 is mounted avoiding the loop structure of the wiring 246, a loop arrangement area of the wiring 246 needs to be ensured in the IC package 240, and hence the size of the entire light transmission module becomes large.

An improved configuration for realizing lower height (reduce optical coupling distance L) may be a configuration of electrically connecting the light emitting and receiving element 230 and the electrode 242 with a liquid conductive material such as silver paste and soldering instead of wire bonding by the wiring 246. However, in such improved configuration, the liquid conductive material tends to diffuse and interfere with the light emitting and receiving point 232.

Patent document 1: Japanese Laid-Open Patent Publication "Japanese Laid-Open Patent Publication No. 2005-321560 (date of publication: Nov. 17, 2005).

Patent document 2: Japanese Laid-Open Patent Publication "Japanese Patent Publication No. 3257776 (registered: Dec. 7, 2001).

Patent document 3: Japanese Laid-Open Patent Publication "Japanese Laid-Open Patent Publication No. 2006-259682 (date of publication: Sep. 28, 2006).

DISCLOSURE OF THE INVENTION

One or more embodiments of the present invention to provide a light transmission module capable of achieving miniaturization and lower height and capable of preventing interference of the liquid conductive material with the light emitting and receiving point, an electronic device, and a manufacturing method of the light transmission module.

In one or more embodiments the light transmission module of the present invention relates to a light transmission module including a light transmission path for transmitting light; an optical element including a light emitting and receiving surface for optically coupling with the light transmitted by the light transmission path, and being formed with a light emitting and receiving point having a function of photoelectric conversion and an electrode pad on the light emitting and receiving surface; a substrate mounted with the optical element and an electrical wiring; and an electrical connecting member for electrically connecting the electrode pad and the electrical wiring; wherein the substrate includes a wiring exposed surface where the electrical wiring is exposed; the electrical connecting member is made of solidified object of a liquid conductive material arranged to contact the electrical wiring, which is exposed at the wiring exposed surface, and the electrode pad; and a projection projecting out with respect to the light emitting and receiving surface is arranged between the electrode pad and the light emitting and receiving point.

The light transmission module of the present invention includes a light transmission path for transmitting light; and an optical element including a light emitting and receiving surface for optically coupling with the light transmitted by the light transmission path, and being formed with a light emitting and receiving point having a function of photoelectric conversion and an electrode pad on the light emitting and receiving surface. That is, the light transmission module of the present invention has a configuration in which the optical element including the light receiving surface is arranged in a direction the light exit from one end face of the light transmission path advances, and the other end face of the light transmission path is arranged in a direction the light exit from the optical element including the light emitting surface advances. Thus, the light emitting and receiving surface of the optical element and the light transmission path are spaced apart in the advancing direction of the light exit from one end face of the light transmission path, or the light exit from the optical element including the light emitting surface. The spaced distance is the optically coupling distance for optically coupling the light emitting and receiving surface and the light transmission path.

In the conventional light transmission module, the electrical connecting member projects out from the forming surface of the electrode pad by the loop height of the wire since wire is used for the electrical connecting member. Thus, setting the optical coupling distance (distance between the light emitting and receiving point and the light transmission path) to smaller than or equal to the loop height of the wire is difficult, and there is a limit to lowering the height of the light transmission module.

In the above configuration, on the other hand, the substrate includes the wiring exposed surface where the electrical wiring is exposed, and the electrical connecting member is made of a solidified object of a liquid conductive material arranged to contact the electrical wiring, which is exposed at the wiring exposed surface, and the electrode pad, and hence the projecting distance from the forming surface of the electrode pad in the electrical connecting member is substantially the thickness of the solidified object of the liquid conductive material. Therefore, according to the above configuration, the distance between the film light guide and the optical element can be reduced, and the height of the module can be lowered compared to the conventional configuration. Furthermore, the power consumption in the optical element serving as a photoelectric conversion element can be reduced since the optical coupling distance can be reduced compared to the conventional light transmission module.

Furthermore, in the light transmission module in which the electrical connecting member is made of a solidified object of a liquid conductive material arranged to contact the electrical wiring, which is exposed at the wiring exposed surface, and the electrode pad, the problem in that the liquid conductive material interferes with the light emitting and receiving point still remains when forming the electrical connecting member made of a solidified object of the liquid conductive material.

According to the above configuration, since the projection projecting out with respect to the light emitting and receiving surface is arranged between the electrode pad and the light emitting and receiving point, the projection acts to stop the liquid conductive material even when the liquid conductive material spreads to the light emitting and receiving point upon forming the electrical connecting member. The interference of the liquid conductive material with the light emitting and receiving point thus can be prevented.

The electronic device of the present invention relates to an electronic device including the light transmission module, wherein the light transmission module further includes electrical connecting means, electrically connected with the electrical wiring, for electrically connecting with an external wiring; and the electrical connecting means at both ends of the light transmission path are respectively connected to a device substrate in the electronic device.

The optical data transmission between the device substrates in the electronic device thus can be carried out by simply electrically connecting the light transmission module between the device substrates. Furthermore, the electronic device can be miniaturized since the light transmission module is mounted to carry out data transmission.

In one or more embodiments the manufacturing method of the light transmission module according to the present invention relates to a manufacturing method of a light transmission module including a light transmission path for transmitting light; an optical element including a light emitting and receiving surface for optically coupling with the light transmitted by the light transmission path, and being formed with a light emitting and receiving point having a function of photoelectric conversion and an electrode pad on the light emitting and receiving surface; a substrate mounted with the optical element and an electrical wiring; and an electrical connecting member for electrically connecting the electrode pad and the electrical wiring; the manufacturing method including electrical connecting step of applying a liquid conductive material so as to contact the electrical wiring and the electrode pad; and projection forming step of forming a projection projecting out with respect to the light emitting and receiving surface of the optical element between the light emitting and receiving point and the electrode pad.

According to such configuration, in the electrical connecting step, the liquid conductive material is applied so as to contact the electrical wiring exposed at the wiring exposed surface and the electrode pad, and hence the distance between the film light guide and the optical element can be reduced and the height of the module can be lowered compared to the conventional configuration. Furthermore, a light transmission module in which the power consumption in the optical element serving as a photoelectric conversion element can be reduced since the optical coupling distance can be reduced compared to the conventional light transmission module can be manufactured.

According to the above configuration, in the projection forming step, the projection projecting out with respect to the light emitting and receiving surface of the optical element is formed between the light emitting and receiving point and the electrode pad, and thus the projection acts to stop the liquid conductive material even when the liquid conductive material spreads to the light emitting and receiving point upon forming the electrical connecting member, and the interference of the liquid conductive material with the light emitting and receiving point can be prevented.

Other further objects, characteristics, and advantages of the present invention should become apparent from the following description.

BRIEF DESCRIPTION OF THE DRAWINGS

FIG. 10(a) is a side cross-sectional view, FIG. 10(b) is a cross-sectional view taken along line AA' of FIG. 10(a), and FIG. 10(c) is a top view.

DESCRIPTION OF SYMBOLS

| | |
|---|---|
| 1 | light transmission module |
| 2 | film light guide (light transmission path) |
| 3 | light emitting and receiving element (optical element) |
| 3a | light emitting and receiving point |
| 3b | electrode pad |
| 4 | height member compensation member |
| 5 | electrical wiring |
| 5a | electrical connecting portion |
| 6 | substrate |
| 7 | electrical wiring portion |
| 7a | exposed surface (wiring exposed surface) |
| 8 | electrical connecting member |
| 9 | projection |

BEST MODE FOR CARRYING OUT THE INVENTION

First Embodiment

One embodiment of the present invention will be described below using the drawings.

Figure 1:
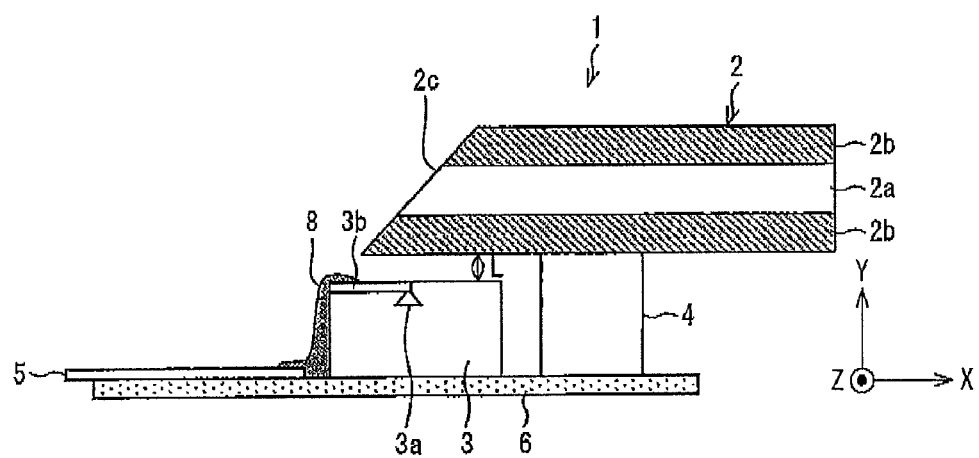
FIG. 1 is a side view showing a schematic configuration of a light transmission module according to one embodiment of the present invention.

FIG. 1 is a side view showing a schematic configuration of a light transmission module 1 according to the present embodiment. The present embodiment shows a configuration serving as a premise of the light transmission module 1 according to the present invention shown in the second embodiment, to be described later. A case in which the light transmission path is a film light guide will be described below, but the light transmission path that can be applied to the present invention merely needs to be a member having the function of transmitting light, and may be a member such as optical fiber, optical filter, and cover glass.

The light transmission module 1 includes a film light guide (light transmission path) 2, a light emitting and receiving element (optical element) 3, a height member compensation member (seat member) 4, an electrical wiring 5, and a substrate 6.

The film light guide 2 is formed by a core 2a having a large index of refraction and a clad 2b having a small index of refraction arranged contacting the periphery of the core 2a, and propagates the optical signal entered to the core 2a while repeating total reflection at the boundary of the core 2a and the clad 2b. The film light guide 2 has flexibility since the core 2a and the clad 2b are made of polymer material having flexibility. Both ends of the film light guide 2 have an inclined surface of 45 degrees, and are an optical path conversion mirror portion 2c for reflecting the optical signal at the inclination surface. The angle of the inclination surface of the optical path conversion mirror portion 2c is not limited to 45 degrees, and can be appropriately changed as long the incident optical signal can be reflected towards the interior of the film light guide 2. In FIG. 1, the longitudinal direction (optical axis direction) of the light guide 2 is the X-axis direction, and the stacking direction of the core 2a and the clad 2b is the Y-axis direction at near the end of the film light guide 2. The Y-axis direction coincides with the normal direction of the mounting surface of the film light guide 2 in the substrate 6. In FIG. 1, a direction perpendicular to the X-axis direction and the Y-axis direction is the Z-axis direction.

The light emitting and receiving element 3 converts the electric signal to the optical signal, and the optical signal to the electric signal. The light emitting and receiving element 3 is a surface emitting and receiving element, and is formed with a light emitting and receiving point 3a serving as an active portion for emitting and receiving the optical signal on the surface opposite to the mounting surface mounted on the substrate 7. An electrode pad 3b electrically connected to the electrical wiring 5 is formed on the surface (light emitting and receiving surface) formed with the light emitting and receiving point 3a.

The height compensation member 4 is a holding member for mounting the film light guide 2, and for maintaining the distance between the film light guide 2 and the light emitting and receiving element 3 constant. The height of the height compensation member 4 is set in advance such that the optical coupling efficiency of the film light guide 2 and the light emitting and receiving element 3 becomes an optimum.

The electrical wiring 5 connects the light emitting and receiving element 3 and an electronic circuit such as a drive circuit, to be described later, and transmits the electric signal. Specifically, the electrical wiring 5 may be a flexible print substrate (FPC), a coaxial cable, a lead frame, and the like.

An electrical connecting portion 5a electrically connects the light emitting and receiving element 3 and an external electronic circuit through the electrical wiring 5.

The substrate 6 is provided to mount the film light guide 2, the light emitting and receiving element 3, the height compensation member 4, the electrical wiring 5, and the electrical connecting portion 5a. The surface of one part of the substrate 6 is an exposed surface (wiring exposed surface) where the electrical wiring 5 is exposed.

In the light transmission module 1, an electrical connecting member 8 is arranged to electrically connect the exposed electrical wiring 5 and the electrode pad 3b. The electrical connecting member 8 is connected to the electrical wiring 5 along the side wall of the light emitting and receiving element 3. That is, the electrical connecting member 8 is configured by a solidified object of a liquid conductive material such as solder and silver paste, and is arranged to contact the exposed electrical wiring 5 and the electrode pad 3b. The electrical connecting member 8 is a member formed as a result of applying and solidifying the liquid conductive material on the electrode pad 3b of the light emitting and receiving element 3.

In the conventional light transmission module, the electrical connecting member projects out from an electrode pad forming surface by the loop height of the wire since the wire is used for the electrical connecting member. In the light transmission module 1, on the other hand, the projecting distance from the forming surface of the electrode pad 3b at the electrical connecting member 8 is substantially the thickness of the solidified object of the liquid conductive material. Therefore, in the light transmission module 1, the distance between the film light guide 2 and the light emitting and receiving element 3 can be reduced and lower height of the module can be realized, compared to the conventional configuration. Furthermore, the optical coupling distance L and the variation in L can be reduced compared to the conventional light transmission module. Thus, the power consumption at the light emitting and receiving element 3 serving as a photoelectric conversion element can be reduced.

Figure 2:
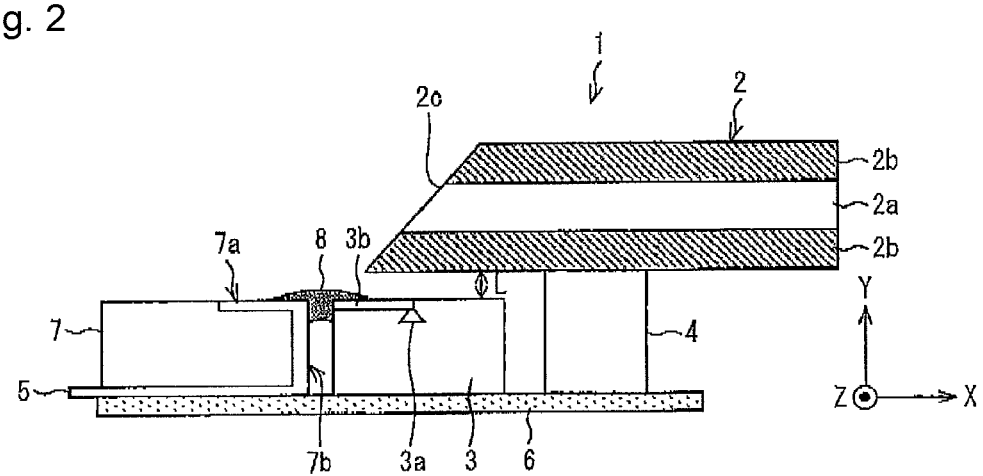
FIG. 2 is a cross-sectional view showing a variant of the light transmission module according to one embodiment of the present invention.

FIG. 2 is a cross-sectional view showing a variant of the light transmission module 1 of the present embodiment. As shown in FIG. 2, the exposed surface (wiring exposed surface), where the electrical wiring 5 is exposed, may be the same height as the forming surface of the electrode pad 3b in the light emitting and receiving element 3.

Specifically, the electrical wiring 5 is mounted on an electrical wiring portion 7 formed on the substrate 6. The electrical wiring portion 7 includes exposed surfaces 7a, 7b where the electrical wiring 5 is exposed. The exposed surface 7a serving as the upper surface of the electrical wiring portion 7 has a height D same as the forming surface of the electrode pad 3b in the light emitting and receiving element 3. The exposed surface 7b is arranged on the side surface facing the light emitting and receiving element 3 in the electrical wiring portion 7. The height D referred herein means the distance from the mounting surface of the light emitting and receiving element 3 in the substrate 6 to the forming surface of the electrode pad 3b or the exposed surface 7a. When referring to "same height", this means that the height is the same within a design range of the light transmission module in practical use. In other words, this means that the height is the same within a measurement limit. The electrical wiring portion 7 merely needs to have a structure projecting out with respect to the mounting surface of the light emitting and receiving element 3 in the substrate 6, and may be a square chip resistor.

The electrical connecting member 8 is arranged to electrically connect the electrical wiring 5 exposed on the exposed surface 7a and the electrode pad 3b. The electrical connecting member 8 is arranged on an insulating portion 10 formed by nonconductive paste. The electrical connecting member 8 is arranged to contact the electrical wiring 5 exposed on the exposed surface 7a, and the electrode pad 3b. That is, the electrical connecting member 8 is a member formed as a result of injecting and solidifying the liquid conductive material to a gap between the light emitting and receiving element 3 and the electrical wiring portion 7.

If the electrical wiring and the electrode pad of the light emitting and receiving element are electrically connected by the liquid conductive material, the electrical connecting portion becomes difficult to form without breaking in the middle if a high and low difference is created between the electrode pad and the electrical wiring as in the conventional light transmission module. Thus, a problem arises in the reliability of the light transmission module. In the light transmission module 1 shown in FIG. 2, however, a stable electrical connection can be realized without breaking in the middle since the high and low difference between the electrical wiring 5 and the electrode pad 3b in the Y-axis direction is zero.

Second Embodiment

Another embodiment of the present invention will be described below using the drawings. In the present embodiment, the same member numbers are denoted for the members having the functions similar to the first embodiment.

The following problems remain when using the liquid conductive material as the electrical connecting portion 8 for electrically connecting the electrode pad 3b of the light emitting and receiving element 3 and the electrical wiring 5 as in the first embodiment.

In other words, when forming the electrical connecting portion 8 made of solidified object of the liquid conductive material, the problem in that the liquid conductive material interferes with the light emitting and receiving point 3a remains. When mounting the light emitting and receiving element 3 on the substrate 6, a mounting shift of about ±10 μm to ±50 μm occurs. Thus, as a realistic problem, a clearance (gap) is necessary between the light emitting and receiving element 3 and the electrical wiring portion 7. The liquid conductive material of an extent of burying the clearance is necessary to form the electrical connecting portion 8 even if the height and low difference between the electrical wiring 5 and the electrode pad 3b in the Y-axis direction is zero. Thus, even if the liquid conductive material is applied to electrically connect the electrode pad 3b of the light emitting and receiving element 3 and the electrical wiring 5, such liquid conductive material reaches the light emitting and receiving point 3a and interferes therewith.

To solve the above problem, a countermeasure of extending the distance between the light emitting and receiving point 3a and the electrode pad 3b in the light emitting and receiving element 3 is considered. However, when adopting such countermeasure for the light transmission module 1 of the first embodiment, the dimension of the light emitting and receiving element 3 becomes large, and miniaturization and lower height of the light transmission module cannot be achieved. The light emitting and receiving element 3 in the light transmission module 1 is manufactured by being cut out from the wafer through dicing and creeping. The number of obtainable chips per wafer reduces if the dimension of the light emitting and receiving element 3 increases. Thus, the cost on the manufacturing of the light emitting and receiving element 3 becomes high.

The light transmission module 1 of the present embodiment prevents interference of the liquid conductive material with the light emitting and receiving point 3a, and enables miniaturization and lower height of the module without the cost for manufacturing the light emitting and receiving element becoming high. FIG. 3(a) is a plan view showing a schematic configuration of the light transmission module 1 of the present embodiment, and FIG. 3(b) is a side cross-sectional view thereof. As shown in the figures, the light transmission module 1 is configured to include the film light guide 2, the light emitting and receiving element 3, the height compensation member 4, the electrical wiring 5, and the substrate 6. The electrical wiring portion 7 of the substrate 6 includes an exposed surface 7a where the electrical wiring 5 is exposed, which exposed surface 7a has a height D same as the forming surface of the electrode pad 3b of the light emitting and receiving element 3. The insulating portion 10 made of nonconductive paste is formed between the light emitting and receiving element 3 and the electrical wiring portion 7. The insulating portion 10 is arranged to electrically insulate the light emitting and receiving element 3 and the electrical wiring portion 7.

As shown in FIG. 3(b), in the present embodiment, a projection 9 projecting out with respect to the light emitting and receiving surface is arranged between the light emitting and receiving point 3a and the electrode pad 3b of the light emitting and receiving element 3. According to such configuration, the projection 9 acts to stop the liquid conductive material when the liquid conductive material spreads towards the light emitting and receiving point 3a upon forming the electrical connecting portion 8. Thus, the interference of the liquid conductive material with the light emitting and receiving point 3a can be prevented.

The length in the X-axis direction of the projection 9 merely needs to be shorter than the distance between the light emitting and receiving point 3a and the electrode pad 3b. The length (width) in the Z-axis direction of the projection 9 merely needs to be greater than the width of the electrical wiring 3c for connecting the light emitting and receiving point 3a and the electrode pad 3b. In view of the dimension of the specific light transmission module, the length in the Z-axis direction of the projection 9 is between 10 μm and 100 μm. The length (height) in the Y-axis direction of the projection 9 is desirably between 20 and 50 μm.

The projection 9 supports the portion projecting out to the light emitting and receiving element 3 side from the height compensation member 4 in the film light guide 2. In other words, the light transmission module 1 has a configuration in which the upper surface of the projection 9 contacts the lower surface of the optical path conversion mirror portion 2c, assuming the Y-axis direction is the up and down direction. The film light guide 2 is thus supported by the height compensation member 4 and the projection 9, and the holding effect in the Y-axis direction of the end of the film light guide 2 is enhanced.

The manufacturing methods of the light transmission module 1 will be described based on FIGS. 4(a) to 4(e). FIGS. 4(a) to 4(e) are cross-sectional views showing each step of the manufacturing method of the light transmission module 1.

First, as shown in FIG. 4(a), the electrical wiring portion 7 is formed on the substrate 6. In the electrical wiring portion 7, the exposed surfaces 7a, 7b, where the electrical wiring 5 is exposed, can be formed by integral molding of resin using a lead frame, forming of pass-through wiring by plating, or processing by sputtering method.

The height compensation member 4 is adhered to the substrate 6 with adhesive, as shown in FIG. 4(b) (seat member mounting step). The method of adhering the substrate 6 and the height compensation member 4 is not particularly limited as long as it is a conventionally known method. For instance, an adhesive sheet is placed on the upper surface of the substrate 6, and the adhesive sheet is patterned on a surface for mounting the height compensation member 4 at the upper surface of the substrate 6 in advance. After mounting the height compensation member 4 on the patterned surface using a mounter, it is heated in the oven to adhere the substrate 6 and the height compensation member 4. In another example, the adhesive is applied to a surface for mounting the height compensation member 4 on the upper surface of the substrate 6 using a dispenser. After mounting the height compensation member 4 on the patterned surface using a mounter on the surface applied with the adhesive, it is heated in the oven to adhere the substrate 6 and the height compensation member 4.

Figure 4:
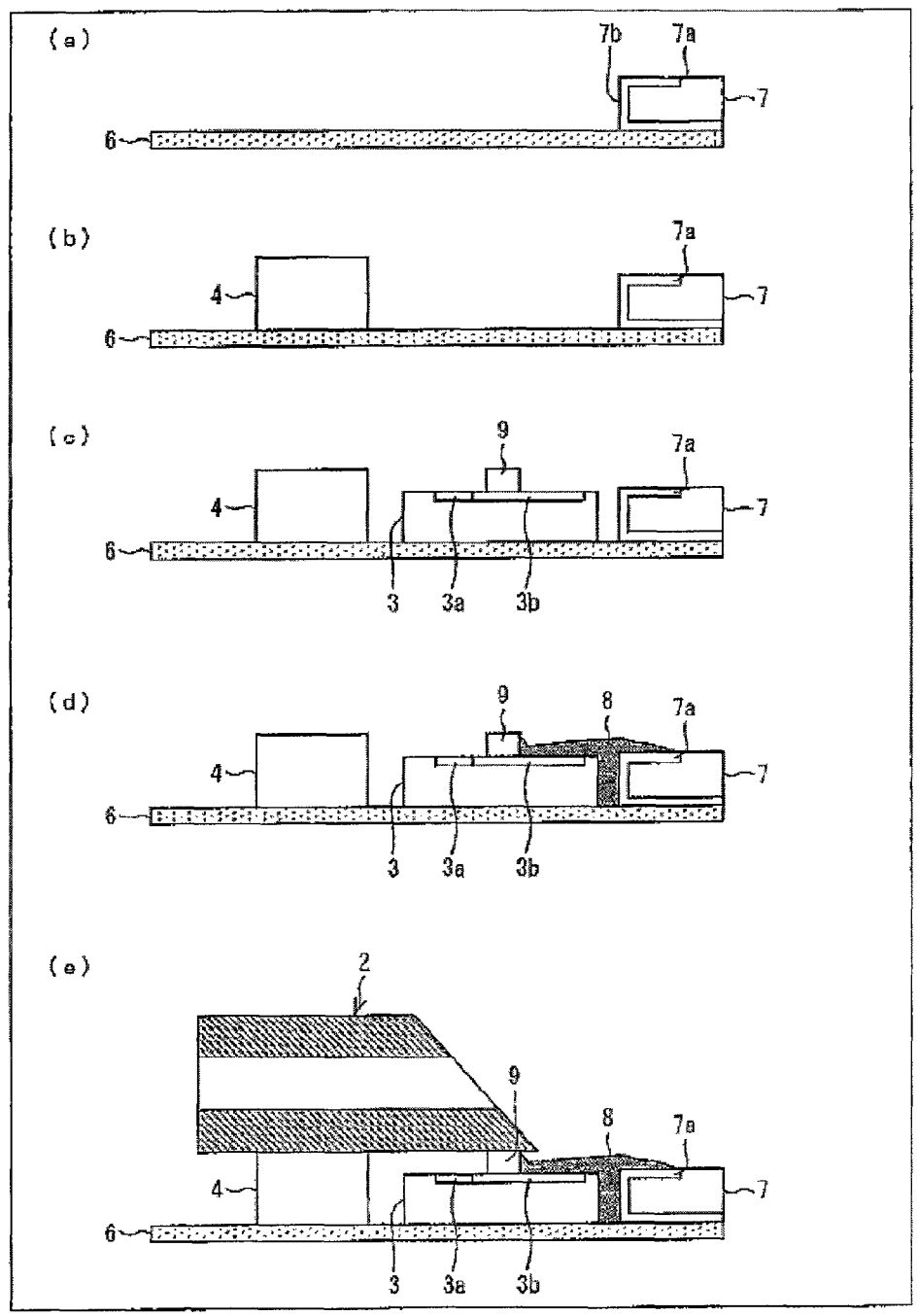
FIGS. 4(a) to 4(e) are cross-sectional views showing each step of the manufacturing method of the light transmission module shown in FIG. 3(a) and FIG. 3(b).

Then, as shown in FIG. 4(*c*), the light emitting and receiving element 3 is mounted on the substrate 6, and the projection 9 is formed between the light emitting and receiving point 3*a* and the electrode pad 3*b* of the light emitting and receiving element 3 (projection forming step). The adhesive used to mount the light emitting and receiving element 3 on the substrate 6 is silver paste. The silver paste is applied to the surface for mounting the light emitting and receiving element 3 of the substrate 6 through the dispense method and the stamp method. The light emitting and receiving element 3 is then mounted on the surface applied with the silver paste, and baked in the oven and the like.

The light emitting and receiving element 3 formed with the projection 9 in advance may be mounted on the substrate 6 in the step (projection forming step) of FIG. 4(*c*). In this case, the light emitting and receiving element 3 formed with a plurality of projections 9 may be collectively manufactured. The light emitting and receiving element 3 in the light transmission module 1 is manufactured by being cut out from the wafer through dicing and creeping (wafer formed with a plurality of light emitting and receiving elements 3 is divided, and the plurality of light emitting and receiving elements 3 is collectively manufactured). After forming the projection 9 on each light emitting and receiving element 3 in the wafer state, the light emitting and receiving element 3 is cut out, so that the light emitting and receiving element 3 formed with a plurality of projections 9 can be collectively manufactured.

A method of forming the projection 9 on each light emitting and receiving element 3 in the wafer state includes patterning through the photolithography method using the resist. When forming the projection 9 through such photolithography method, the projection 9 may be formed by applying the resist on the wafer, and then performing exposure and patterning so as to remain the forming position of the projection 9 in each light emitting and receiving element 3 of the wafer. In this case, the formed projection 9 is made of resist. The projection 9 may be formed by applying the resist on the wafer, performing exposure and patterning so as to remove the forming position of the projection 9 in each light emitting and receiving element 3 of the wafer, and performing plating process to remove the resist. In this case, the formed projection 9 is made of metal used in the plating process.

After the step of FIG. 4(*c*), the electrode pad 3*b* in the light emitting and receiving element 3 and the electrical wiring 5 exposed on the exposed surface 7*a* are electrically connected using the liquid conductive material such as silver paste and solder (electrical connecting step), as shown in FIG. 4(*d*). The liquid conductive material is applied to the gap between the light emitting and receiving element 3 and the electrical wiring portion 7 using the dispenser to contact the electrode pad 3*b* and the electrical wiring 5. In this case, the interference of the liquid conductive material with the light emitting and receiving point 3*a* can be prevented. If the liquid conductive material is silver paste, heating is carried out by baking in the oven after the application. If the liquid conductive material is solder, adhering is carried out through reflow.

After the step of FIG. 4(*d*), the film light guide 2 is mounted on the substrate 6 (film light guide mounting step), as shown in FIG. 4(*e*). In this case, the adhesive is applied to the surface that contacts the film light guide 2 in the height compensation member 4 and the projection 9 to mount the film light guide 2. The dispenser is used when applying the adhesive to the projection 9. After applying the adhesive to the height compensation member 4 and the projection 9, the film light guide 2 is mounted using the mounter. The mounting position of the film light guide 2 in the substrate 6 is the position where the optical path conversion mirror portion 2*c* of the film light guide 2 overlaps the projection 9 in the X-Z plane. The adhesive applied to the height compensation member 4 and the projection 9 preferably uses UV curable resin to eliminate the influence of heat on the film light guide 2 after the adhesion.

Thus, in the light transmission module 1, the height compensation member 4 and the projection 9, and the film light guide 2 are fixed with an adhesive. Furthermore, the film light guide 2 is fixed to the projection 9 arranged in the vicinity of the light emitting and receiving point 3*a* of the light emitting and receiving element 3. Thus, the portion projecting towards the light emitting and receiving element 3 side from the height compensation member 4 in the film light guide 2 can be prevented from bending due to its own weight. Furthermore, the deformation of the film light guide 2 can be suppressed when vibration and impact are applied on the light transmission module 1.

As shown in FIG. 4(*b*), in the manufacturing method of the light transmission module 1, the height compensation member 4 is adhered to the substrate 6 with the adhesive (seat member mounting step). However, in the seat member mounting step, the height compensation member 4 and the substrate 6 may be integrally manufactured in advance using resin molding.

In the manufacturing method of the light transmission module 1 of the present embodiment, the step of mounting the light emitting and receiving element 3 on the substrate 6 (i.e., exclude step of forming the projection 9 on the light emitting and receiving surface of the light emitting and receiving element 3) is executed instead of the step shown in FIG. 4(*c*), and then the steps shown in FIGS. 4(*d*) and 4(*e*) are performed to complete the light transmission module 1 of the first embodiment.

Figure 5:
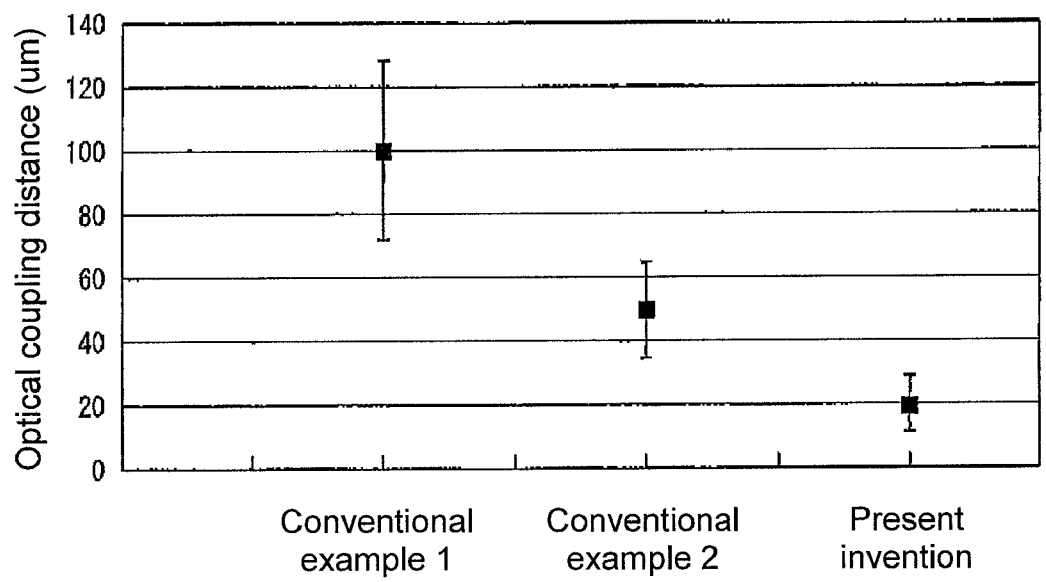
FIG. 5 is a graph showing the set value and the variation in the optical coupling distance in the light transmission modules of the conventional example 1 (patent document 1), the conventional example 2 (patent document 2), and the present invention.

The inventors of the invention compared and reviewed the light transmission module 1 according to the present invention, the light transmission module having the configuration disclosed in patent document 1 (hereinafter referred to as light transmission module of conventional example 1) and the light transmission module having the configuration disclosed in patent document 2 (hereinafter referred to as light transmission module of conventional example 2) about variation reduction effect of the optical coupling distance L. The compared result is shown in table 1 and FIG. 5. Table 1 is a table showing the result of comparing the variation in the optical coupling distance L in the light transmission modules of the conventional example 1, the conventional example 2, and the present invention. FIG. 5 is a graph showing the set value (Typ value) and the variation in the optical coupling distance L in the light transmission modules of the conventional example 1, the conventional example 2, and the present invention.

TABLE 1

|  | Variation in optical coupling distance (±) |
|---|---|
| Light transmission module of conventional example 1 | 28 |
| items   Variation in sub-mount height | 10 |

TABLE 1-continued

|  | Variation in optical coupling distance (±) |
|---|---|
| Variation in thickness of adhesive of sub-mount | 4 |
| Variation in height of light emitting and receiving element | 10 |
| Variation in thickness of adhesive of light emitting and receiving element | 4 |
| Light transmission module of conventional example 2 items | 15 |
| Variation in height of optical device | 15 |
| Light transmission module of present invention items | 9 |
| Variation in thickness of adhesive | 4 |
| Variation in height of projection member | 5 |

As shown in table 1, the variation in the optical coupling distance L in the light transmission module 1 of the present invention is suppressed smaller than the light transmission module of the conventional examples 1 and 2. As shown in FIG. 5, in the light transmission module 1 of the present invention, the set value of the optical coupling distance L can be set small compared to the light transmission module of the conventional examples 1 and 2. The problems of the light transmission module of the conventional examples 1 and 2, and the effect of reducing the variation in the optical coupling distance L in the light transmission module 1 will be reviewed below.

Figure 18:
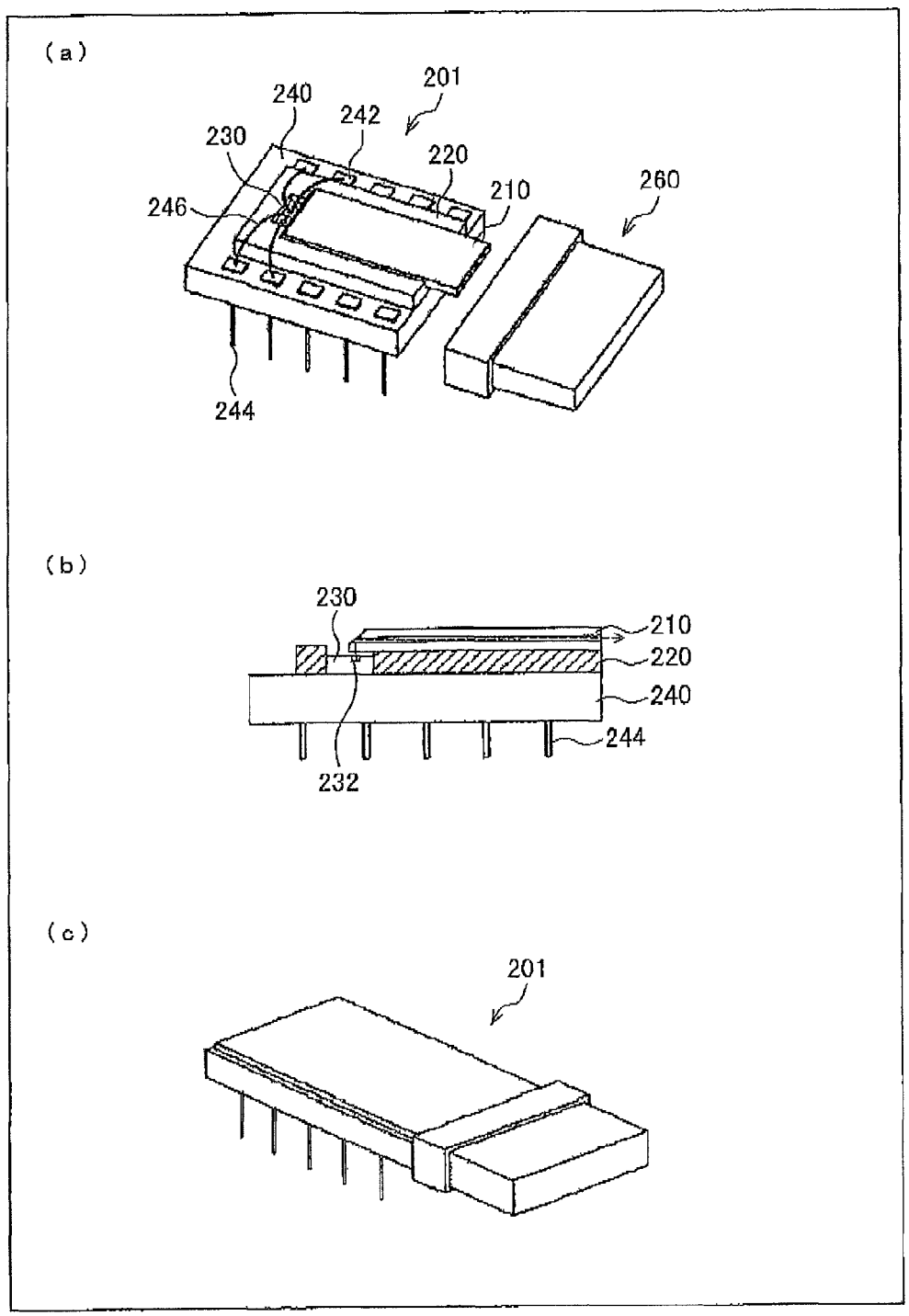
FIG. 18(a) is a perspective view of a conventional light guide module disclosed in patent document 1.
FIG. 18(b) is a side cross-sectional view thereof.
FIG. 18(c) is a perspective view of an air tightly packaged conventional light guide module.

First, in the light transmission module of the conventional example 1 shown in FIG. 18, the adhesive for mounting the light emitting and receiving element 230 and the sub-mount 220 on the IC package 240, and the adhesive for adhering the sub-mount 220 and the light guide film 210 are required. In the light transmission module of the conventional example 1, the optical coupling distance L needs to be set in view of the thickness of the adhesive layer formed by the adhesive in addition to the heights of the light emitting and receiving element 230 and the sub-mount 220 when mounting the light guide film 210 on the IC package 240. In the conventional example 1, the variation in the optical coupling distance L is caused by the processing tolerance of the light emitting and receiving element 230 and the sub-mount 220, and the thickness variation in the adhesive layer formed by the adhesive. Generally, the adhering process by the adhesive is carried out by applying load after applying the adhesive on the light emitting and receiving element 230 and the sub-mount 220 and mounting the light guide film 210. The thickness of the adhesive layer tends to vary due to the application amount of the adhesive and the variation in the load. Strictly controlling the application amount of the adhesive and the load is difficult when manufacturing each light transmission module. Therefore, the variation in the optical coupling distance L becomes large in the light transmission module of the conventional example 1. If the variation in the optical coupling distance L is large, the set value of the optical coupling distance L needs to be set large to an extent such variation can be ignored. In the conventional example 1, the processing accuracy of the sub-mount 220 needs to be high to have the set value and the variation in the optical coupling distance L small in the conventional example 1, and hence the processing cost of the sub-mount 220 increases.

Figure 19:
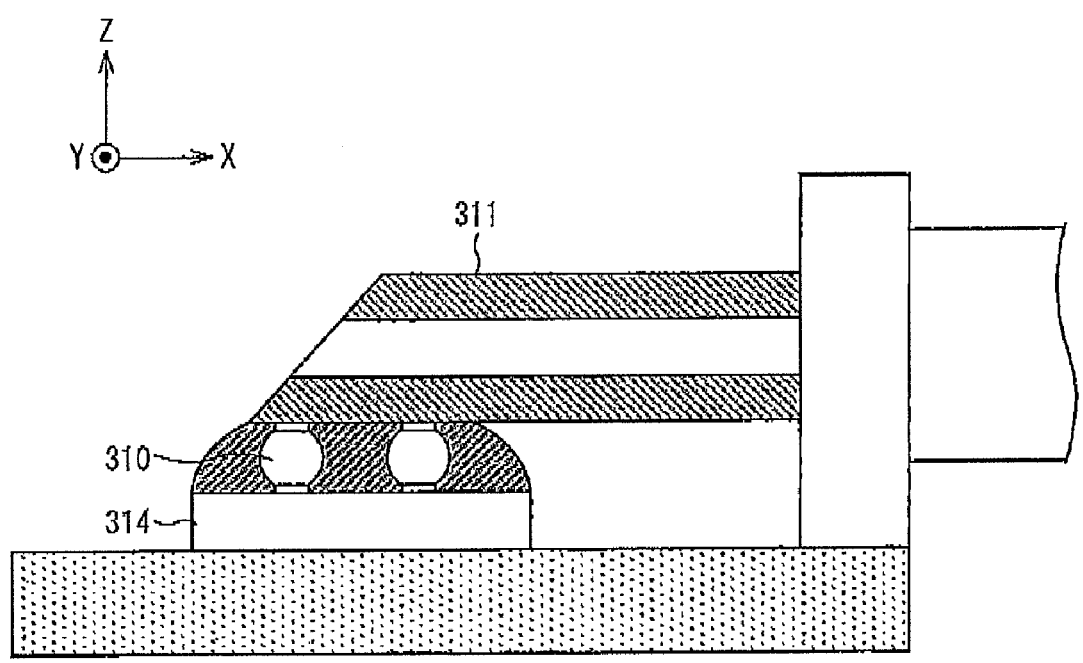
FIG. 19 is a side cross-sectional view of a conventional light transmission module disclosed in patent document 2.

In the light transmission module of conventional example 2 shown in FIG. 19, the film optical wiring 311 and the optical device 314 are adhered by way of the bump 310. Thus, the optical coupling distance L can be reduced by setting the size of the bump 310. However, the size of the bump 310 changes when the soldering material configuring the bump 310 melts. The change in size of the bump 310 involved in the melting of the soldering material causes variation in the optical coupling distance L. Generally, the height of the standard solder bump 310 is 50 μm±15 μm. Thus, in the light transmission module of conventional example 2, the optical coupling distance L is limited to being set to the set value of 50 μm and the variation of 15 μm.

When forming the solder bump 310 on the wafer including the optical element, the number of processing steps increases by simply forming the solder bump 310 on the wafer. Specifically, the step of forming the seed layer on the wafer, the step of applying the photoresist on the seed layer and patterning the photoresist, the step of performing solder plating based on the photoresist pattern, the step I of stripping the photoresist and etching the seed layer, and the step II of reflowing and forming the bump are required to form the solder bump 310. The cost of the optical device 314 thus increases. Furthermore, when proceeding from step I to step II, the optical device 314 is exposed to high temperature by the reflow. The optical device 314 is also exposed to high temperature by reflow when mounting the film optical wiring 311 after forming the bump 310 in step II. Thus, the film optical wiring 311 and the optical device 314 are required to have heat resistance of higher than or equal to 260° C. with respect to the high temperature.

In the light transmission module 1 of the present invention, the height position in the Y-direction in the film light guide 2 is substantially set only by the projection 9 in the light emitting and receiving element 3. As shown in FIG. 3(b), the projection 9 has small thickness (in the Y-axis direction) compared to the height compensation member 4 and the light emitting and receiving element 3. Thus, when processing the projection 9 and forming the same on the light emitting and receiving element 3, the processing variation of the projection 9 becomes very small compared to the light emitting and receiving element 3 and the height compensation member 4. Thus, the variation in the optical coupling distance L between the film light guide 2 and the light emitting and receiving element 3 can be reduced very small. As described in the manufacturing method of the light transmission module 1, the parallelism of the film light guide 2 and the light emitting and receiving surface of the light emitting and receiving element 3 becomes high since the adhering process with the film light guide 2 is performed on the surface of the projection 9 when adhering the film light guide 2 and the projection 9 using the adhesive. Therefore, the optical coupling having high reliability can be realized according to the light transmission module 1. In manufacturing the light transmission module 1, resin of UV curable type or natural curable type can be used for the adhesive. Such adhesive joins the film light guide 2 and the light emitting and receiving element 3 at low temperature compared to the solder bump in the light transmission module of conventional example 2. Therefore, limitations such as heat resistance are not necessary for the film light guide 2 in the light transmission module 1.

(Variant 1)

Figure 6:
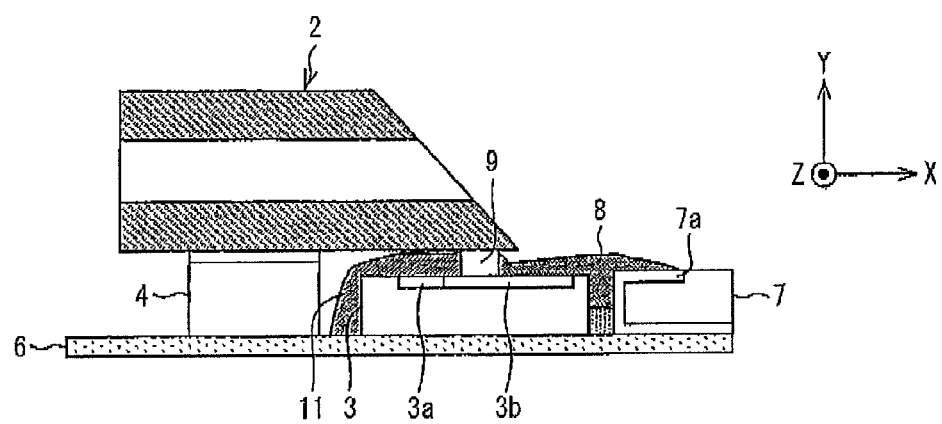
FIG. 6 is a cross-sectional view showing a schematic configuration of the light transmission module serving as variant 1.

A variant of the configuration shown in FIGS. 3(a) and 3(b) will be described in the configuration of the light transmission module 1 of the present embodiment. FIG. 6 shows a cross-sectional view of the light transmission module 1 serving as variant 1. In the light transmission module 1 shown in FIGS. 3(a) and 3(b), the portion on the height compensation member 4 side than the projection 9 is exposed in the light emitting and receiving element 3.

The light transmission module 1 of variant 1, on the other hand, has the light emitting and receiving point 3a in the light emitting and receiving element 3 sealed by a sealing agent 11.

Thus, attachment of dirt and dust to the light emitting and receiving surface of the light emitting and receiving element 3 can be prevented, and the light transmission module 1 having high reliability can be realized.

The sealing method of the sealing agent 11 to the light emitting and receiving surface 3 includes applying the sealing agent 11 to the light emitting and receiving surface of the light emitting and receiving element 3 by the dispenser (potting sealing) after the step of FIG. 4(*c*) or FIG. 4(*d*). The light emitting and receiving surface of the light emitting and receiving element 3 is sealed by the sealing agent 11 by baking the sealing agent 11 in the oven. The sealing agent 11 may consist of UV curable resin. In this case, the sealing agent 11 is UV-cured instead of being baked in the oven.

The material of the sealing agent 11 is preferably transparent resin capable of transmitting the light emitted and received by the light emitting and receiving element 3. The material of the sealing agent 11 includes silicon resin, epoxy resin, or acrylic resin.

The size and the position of the sealing agent 11 are not limited as long as it is formed so as to cover at least the light emitting and receiving surface of the light emitting and receiving element 3. For instance, the sealing agent 11 may be attached and formed on the side surface of the light emitting and receiving element 3, the substrate 6, and the height compensation member 4 in addition to the light emitting and receiving surface of the light emitting and receiving element 3.

(Variant 2)

Figure 3:
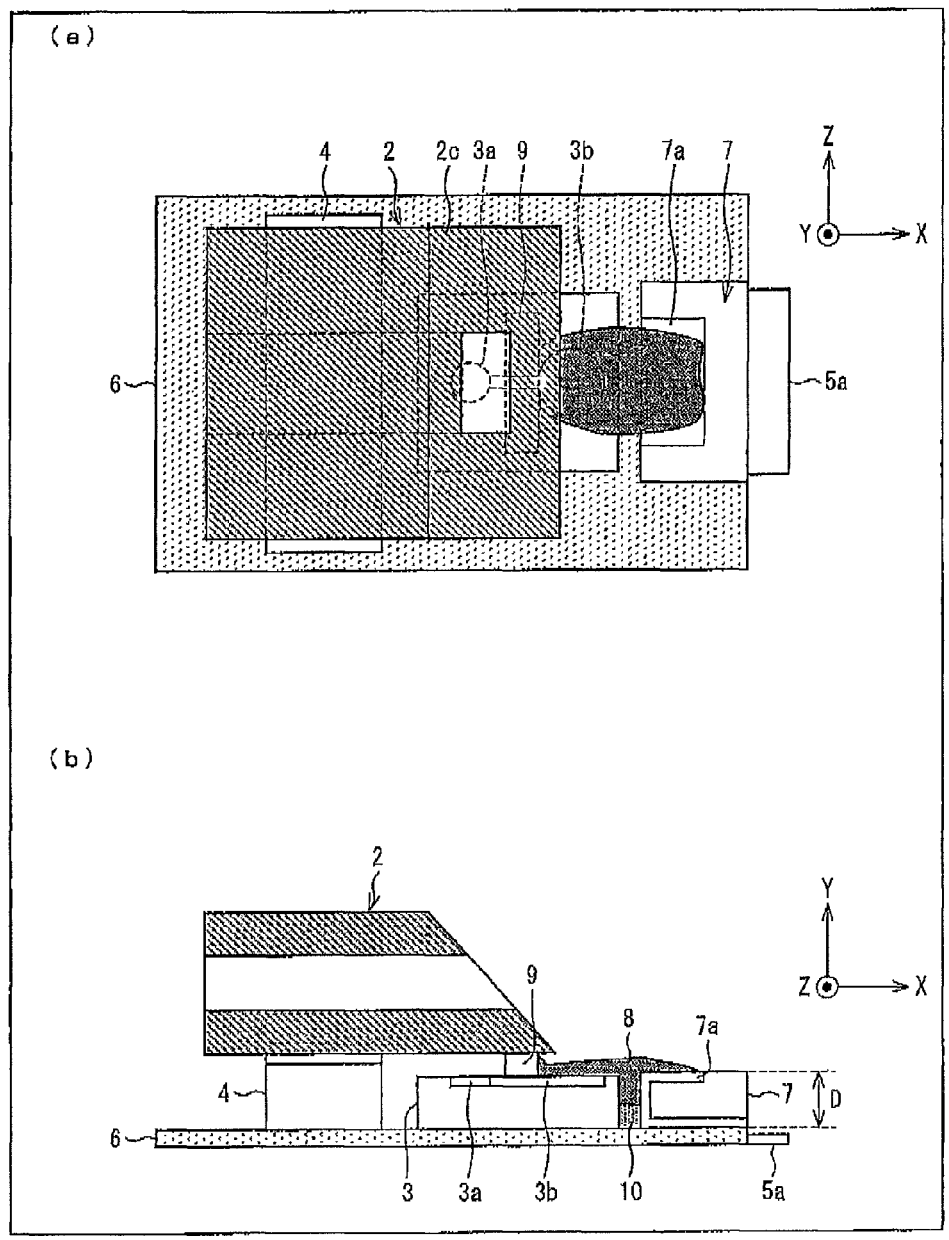
FIG. 3(a) is a plan view showing a schematic configuration of the light transmission module of another embodiment of the present invention.
FIG. 3(b) is a side cross-sectional view thereof.
Figure 7:
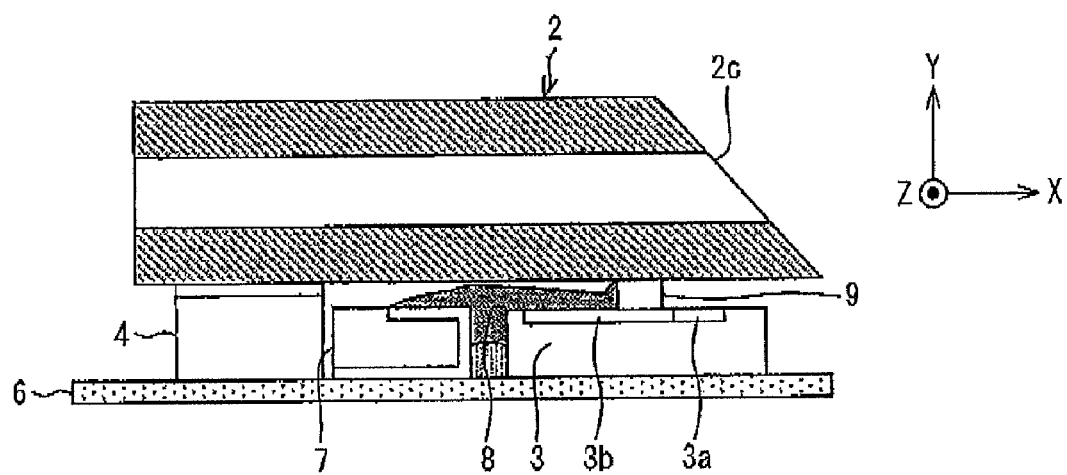
FIG. 7 is a cross-sectional view showing a schematic configuration of the light transmission module serving as variant 2.

Another variant of the configuration shown in FIGS. 3(*a*) and 3(*b*) will be described in the configuration of the light transmission module 1 of the present embodiment. FIG. 7 shows a cross-sectional view of the light transmission module 1 serving as variant 2. In the light transmission module 1 shown in FIGS. 3(*a*) and 3(*b*), the electrical wiring portion 7 is arranged on the side opposite to the height compensation member 4 in the light emitting and receiving element 3. That is, the light emitting and receiving element 3 is arranged between the height compensation member 4 and the electrical wiring portion 7.

The light transmission module 1 of variant 2, on the other hand, has the electrical wiring portion 7 arranged on the height compensation member 4 side in the light emitting and receiving element 3. That is, the electrical wiring portion 7 is arranged between the light emitting and receiving element 3 and the height compensation member 4. Furthermore, the light emitting and receiving element 3 is arranged with respect to the height compensation member 4 so that the projection 9 is positioned between the height compensation member 4 and the light emitting and receiving point 3*a* in the X-axis direction. Thus, the projection amount in the X-axis direction of the optical path conversion mirror portion 2*c* (projection amount from the projection 9) can be determined by the distance between the light emitting and receiving point 3*a* and the projection 9. The distance between the projection 9 and the light emitting and receiving point 3*a* can be set so that the projection 9 contacts the end on the height compensation member 4 side of the optical path conversion mirror portion 2*c* of the film light guide 2 in the X-axis direction. The hanging amount of the optical path conversion mirror portion 2*c* of the film light guide 2 then can be reduced. The variation in the optical coupling distance L can be reduced, and lower power consumption can be achieved.

In the light transmission module 1 of variant 2, the light emitting and receiving point 3*a* in the light emitting and receiving element 3 may be sealed by the sealing agent 11, similar to variant 1. In this case, the thickness of the layer of the sealing agent 11 to be formed is preferably between a few µm to 30 µm.

(Variant 3)

Figure 8:
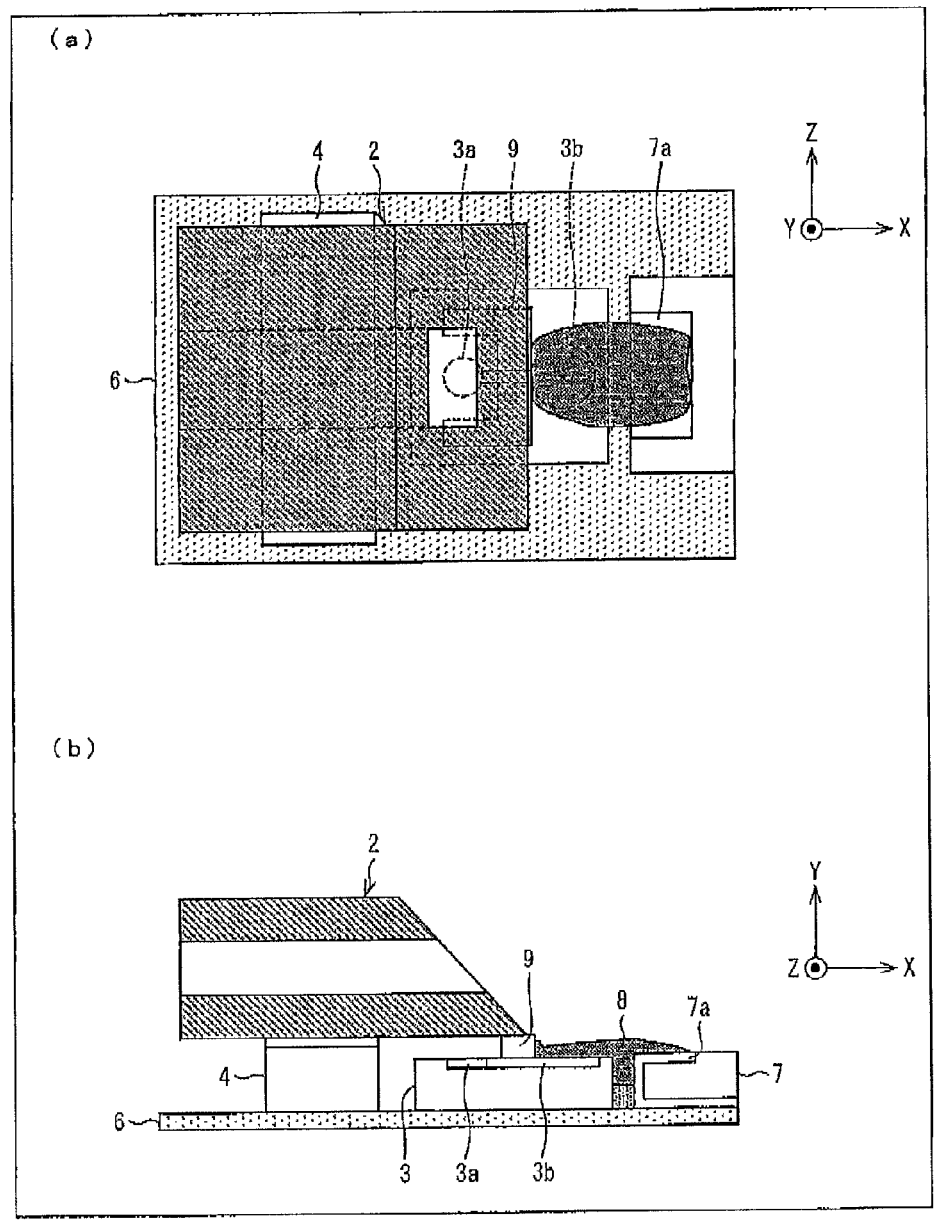
FIGS. 8(a) and 8(b) are a top view and a cross-sectional view showing a schematic configuration of the light transmission module serving as variant 3.

Another further variant of the configuration shown in FIGS. 3(*a*) and 3(*b*) will be described in the configuration of the light transmission module 1 of the present embodiment. FIGS. 8(*a*) and 8(*b*) show a top view and a cross-sectional view of the light transmission module 1 serving as variant 3.

As shown in FIG. 8(*a*), in the light transmission module 1 of variant 3, the projection 9 is formed to a horseshoe shape so as to surround the light emitting and receiving point 3*a* when seen from the Y-axis direction. The contacting area of the film light guide 2 and the projection 9 thus increases, and the holding effect of the film light guide 2 by the projection 9 increases. The parallelism of the film light guide 2 and the light emitting and receiving surface of the light emitting and receiving element 3 is further enhanced, and lower power consumption can be realized.

The shape of the projection 9 is not limited to the horseshoe shape as long as it is formed to surround the light emitting and receiving point 3*a* of the light emitting and receiving element 3. For instance, the shape of the projection 9 may be a square shape. In this case, the contacting area of the film light guide 2 and the projection 9 increases, and the holding effect of the film light guide 2 by the projection 9 increases. As a result, the deformation of the film light guide 2 is less likely to occur with respect to stress by vibration, impact and the like of the light transmission module 1, and the reliability of the optical coupling is further enhanced.

(Variant 4)

Figure 9:
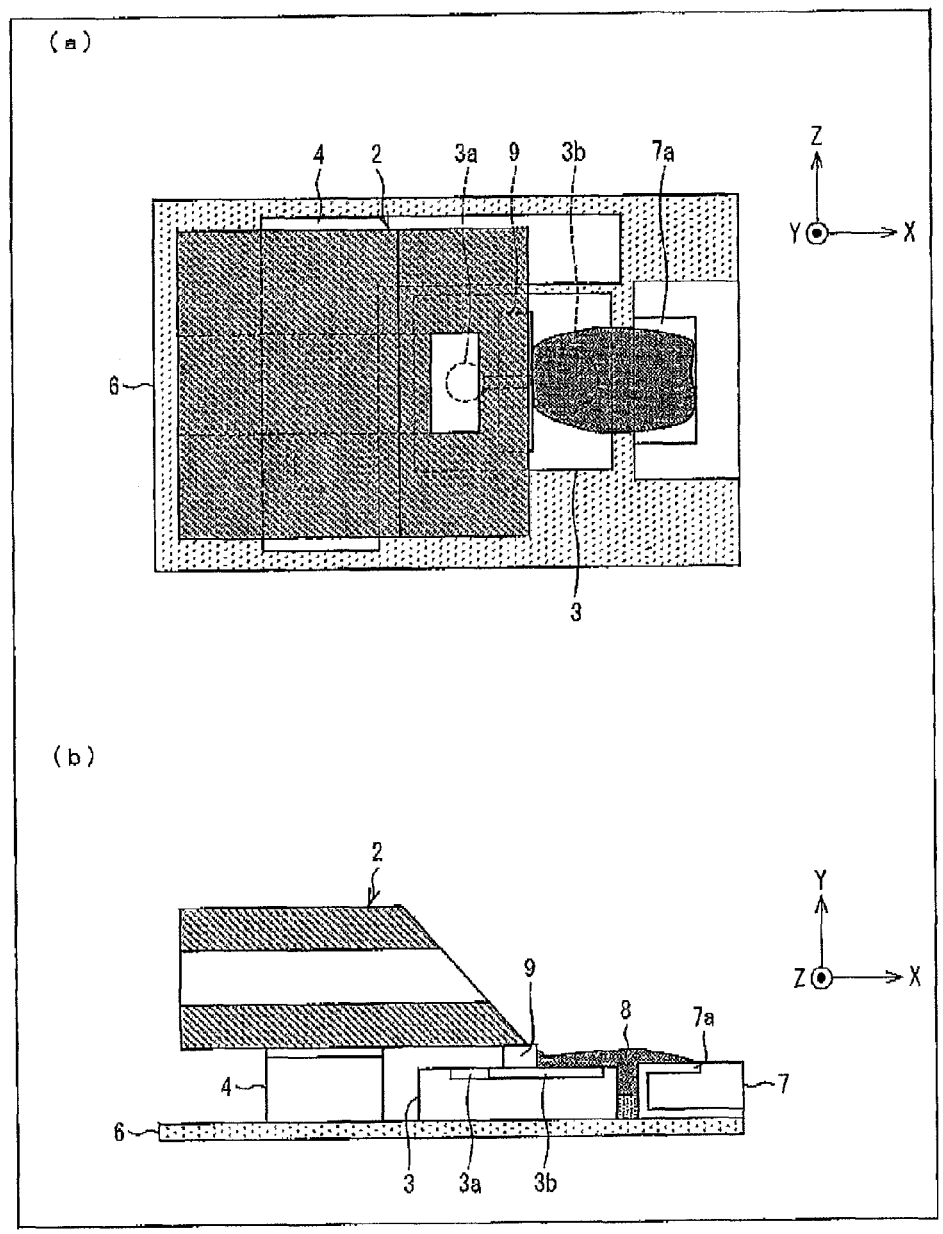
FIGS. 9(a) and 9(b) are a top view and a cross-sectional view showing a schematic configuration of the light transmission module serving as variant 4.

Another further variant of the configuration shown in FIGS. 3(*a*) and 3(*b*) will be described in the configuration of the light transmission module 1 of the present embodiment. FIGS. 9(*a*) and 9(*b*) show a top view and a cross-sectional view of the light transmission module 1 serving as variant 4.

The light transmission module 1 of variant 4 has a configuration in which the region in the vicinity of one of the two side surfaces parallel to the light transmitting direction of the film light guide 2 is supported by the height compensation member 4 at the lower side surface of the portion (hereinafter referred to as projecting portion) the film light guide 2 projects out to the light emitting and receiving element 3 side from the upper surface of the height compensation member 4. In other words, the shape of the wall surface on the light emitting and receiving element 3 side in the height compensation member 4 is L-shape, and the lower side surface of the projecting portion of the film light guide 2 is supported with two sides. Furthermore, the light transmission module 1 of variant 4 has a so-called cantilever supporting structure in which the height compensation member 4 supports one of the two ends in the Z-axis direction (width direction) of the film light guide 2.

According to such configuration, one lateral side with respect to the projecting direction of the projecting portion in the film light guide 2 is supported by the height compensation member 4, and thus the bend of the projecting portion by weight, impact, vibration, and the like can be suppressed. The reliability in the optical coupling of the film light guide 2 and the light emitting and receiving element 3 thus can be enhanced.

Figure 10:
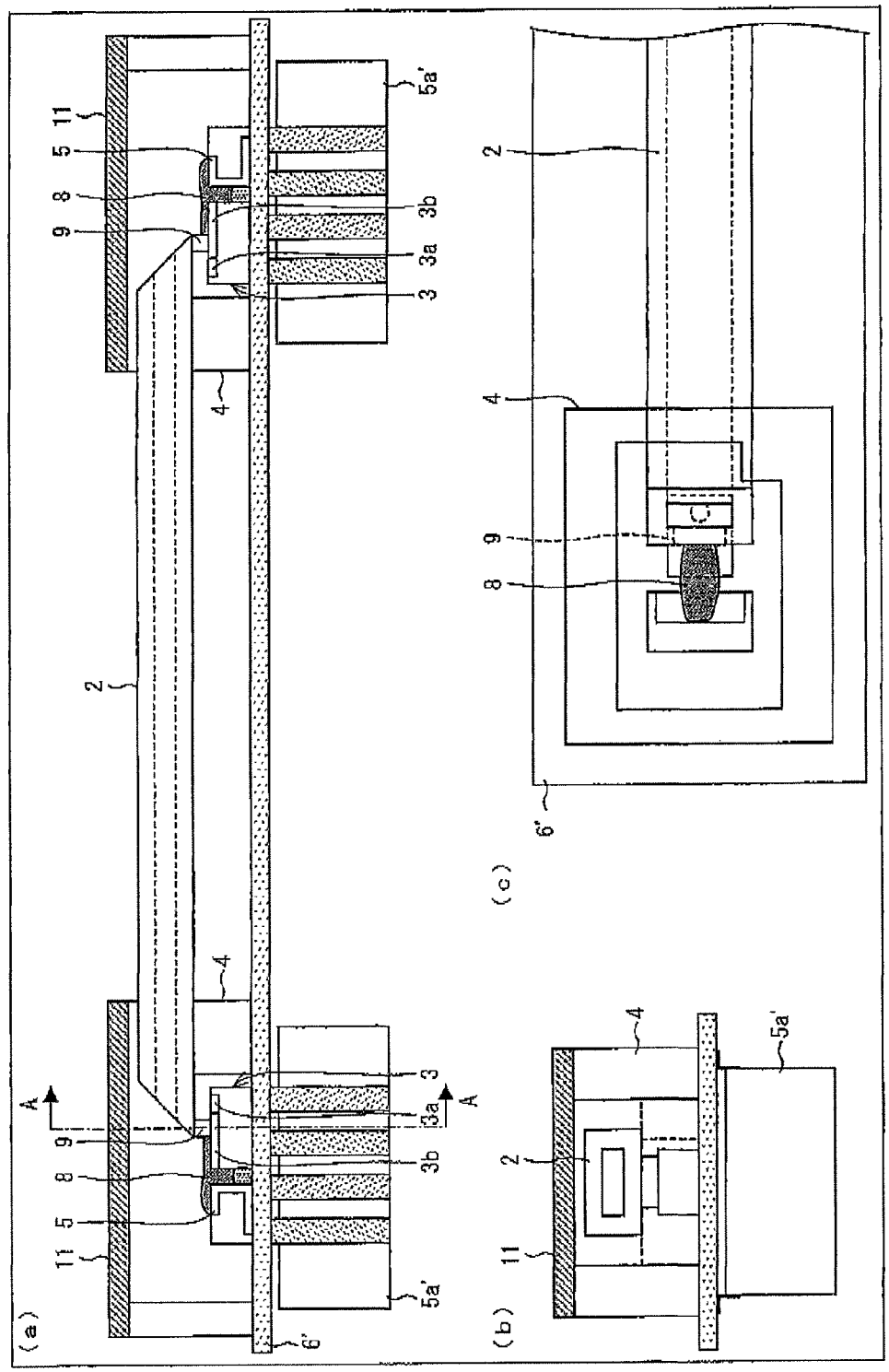
FIGS. 10(a) to 10(c) show an entire light transmission module using the optical wiring serving as the film light guide and the electrical wiring substrate, where

A specific example of the light transmission module 1 for implementing the inter-substrate wiring will now be described. FIGS. 10(*a*) to 10(*c*) show an entire light transmission module using the optical wiring serving as the film light guide and the electrical wiring substrate, where FIG. 10(*a*) is a side cross-sectional view, FIG. 10(b) is a cross-sectional view taken along line AA' of FIG. 10(a), and FIG. 10(c) is a top view.

In the configuration shown in the figure, one film light guide 2 is arranged on the electrical wiring substrate 6' serving as one substrate 6, and the light emitting and receiving element 3 and the height compensation member 4 are arranged in correspondence to the two ends of the film light guide 2.

The film light guide 2 is fixed on the height compensation member 4 with an adhesive. The height compensation member 4 has a cantilever structure for holding one end in the width direction of the film light guide 2. As shown in FIG. 10(c), the height compensation member 4 is formed to surround the periphery of the light emitting and receiving element 3. Thus, when injecting the sealing agent and forming the sealing resin portion to ensure the reliability of the light emitting and receiving element 3, the sealing agent can be banked up by the height compensation member 4. The thickness and the spreading amount of the sealing resin portion for sealing the light emitting and receiving element 3 thus can be controlled, and a miniaturized light transmission module having high reliability can be fabricated. A lid member 10 is arranged on the height compensation member 4 for surrounding the light emitting and receiving element 3. In other words, the lid member 10 is arranged to close the opening formed by the inner walls of the height compensation member 4.

The light emitting and receiving element 3 includes the projection 9, the light emitting and receiving point 3a, and the electrode 3b on the same surface. The projection 9 is arranged between the light emitting and receiving point 3a and the electrode pad 3b. The projection 9 and the film light guide 2 are preferably adhered in the light transmission module 1. The film light guide 2 and the light emitting and receiving point 3a in the light emitting and receiving element 3 are optically coupled.

Similar to the configuration shown in FIGS. 3(a) and 3(b), the electrode pad 3b of the light emitting and receiving element 3 and the potential wiring 5 are electrically connected by the electrical connecting member 8. The role of the projection 9 is similar to that in the configuration shown in FIGS. 3(a) and 3(b), and thus the description will be omitted here.

A connector 5a' serving as the electrical connecting portion 5a is arranged on the surface on the side opposite to the light emitting and receiving element 3 in the electrical wiring substrate 6'. The connector 5a' and the electrical wiring of the electrical wiring substrate 6' are electrically connected by materials such as solder. The light transmission module can be miniaturized since the light emitting and receiving element 3 and the connector 5a' are arranged sandwiching the electrical wiring substrate 6'. The electrical wiring substrate 6' may be an FPC having a double-sided electrical wiring, a gala epoxy substrate, or the like. If the electrical wiring substrate 6' is a flexible substrate such as the FPC, a resin material such as epoxy resin may be filled between the connector 5a' and the electrical wiring substrate 6' to enhance the rigidity of the entire light transmission module.

Figure 11:
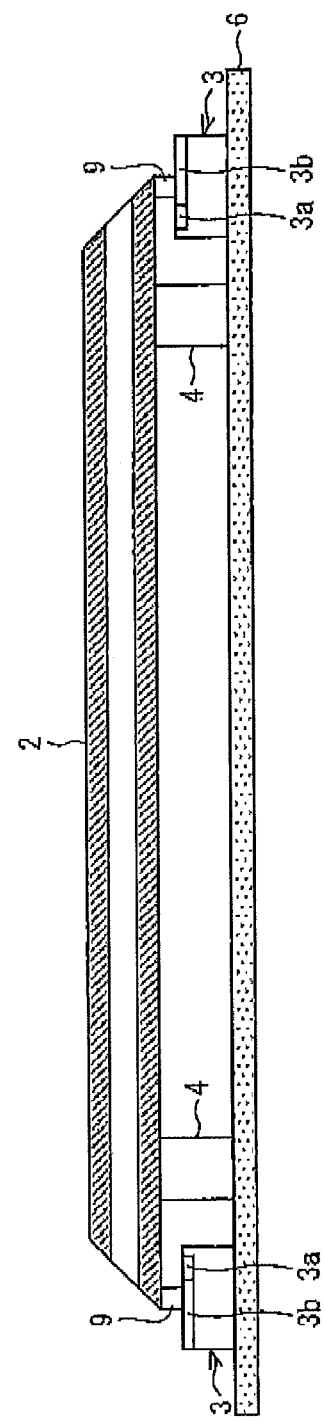
FIG. 11 is a side cross-sectional view showing a schematic configuration of the light transmission module for connecting the substrates by the substrate and the film light guide.

FIG. 11 is a side cross-sectional view showing a schematic configuration of the light transmission module of connecting the substrates by the substrate 6 and the film light guide 2. The configuration shown in FIGS. 10(a) to 10(c) is a configuration in which the height compensation member 4 surrounds the light emitting and receiving element 3. However, the light transmission module 1 is not limited to such configuration, and merely needs to be a configuration in which the film light guide 2 is supported by the height compensation member 4. For instance, the configuration shown in FIG. 11 may be adopted. In FIG. 11, the height compensation member 4 supports the inner side portion in the X-direction than the light emitting and receiving element 3 in the film light guide 2. The projection 9 supports the portion projecting out to the light emitting and receiving element 3 side from the height compensation member 4 in the film light guide 2.

Figure 12:
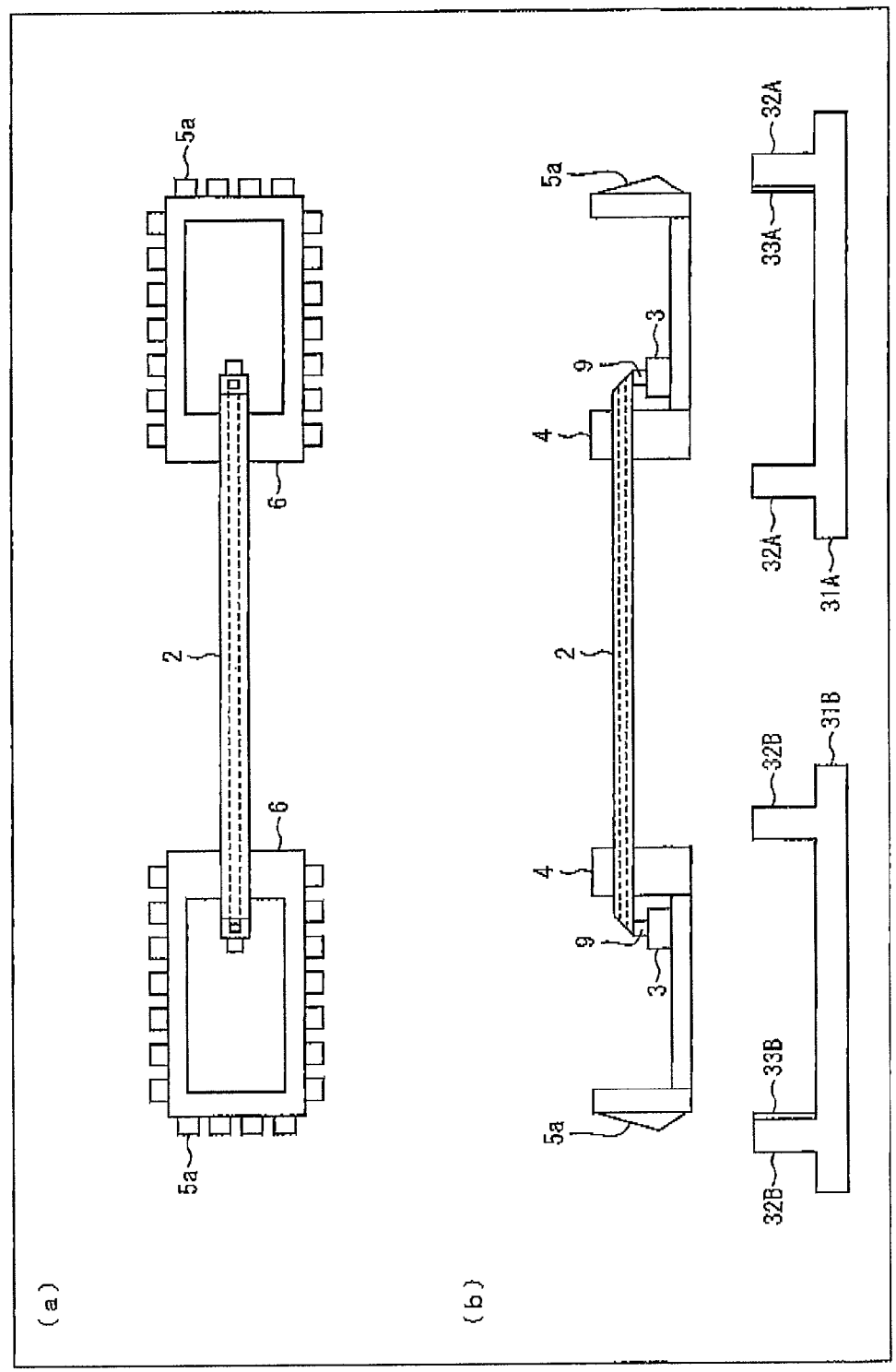
FIG. 12(a) is a plan view showing a schematic configuration of the light transmission module in which two units, each including the height compensation member, the light emitting and receiving element, and the electrical wiring, are arranged on different substrates.
FIG. 12(b) is a side cross-sectional view thereof.

In the configurations shown in FIGS. 10(a) to 10(c) and FIG. 11, two units, each including the height compensation member 4 and the light emitting and receiving element 3, are arranged on one substrate 6, but the units may be arranged on different substrates 6, as shown in FIGS. 12(a) and 12(b). In the case of such configuration, the member for connecting an external wiring substrate 31A and a wiring substrate 31B is only the film light guide 2. Thus, the degree of freedom in the path for connecting the wiring substrates can be enhanced by utilizing the flexibility of the film light guide 2 even when the wiring substrate 31A and the wiring substrate 31B are not on the same plane, and the like. Furthermore, the electrical connecting portions 5a . . . is arranged on the external side surface of the height compensation member 4. The external wiring substrates 31A and 31B respectively include a connection holding member 32A and 32B as well as an electrical connecting portion 33A and 33B. The external wiring substrate 31A and the wiring substrate 31B can be signal-connected by light transmission by connecting the external wiring substrates 31A and 31B to the light transmission module 1.

In the configuration shown in FIG. 11, the degree of freedom in the connection path of the wiring substrate 31A and the wiring substrate 31B can be enhanced by configuring the substrate 6 by a flexible substrate. If, however, the substrate 6 and the film light guide 2 are arranged between two wiring substrates 31A and 31B, the degree of freedom in the path may be limited if the substrate 6 and the film light guide 2 physically interfere with each other, but such interference does not occur if the wiring substrates are connected with only the film light guide 2, and thus the degree of freedom in the path can be enhanced.

Figure 13:
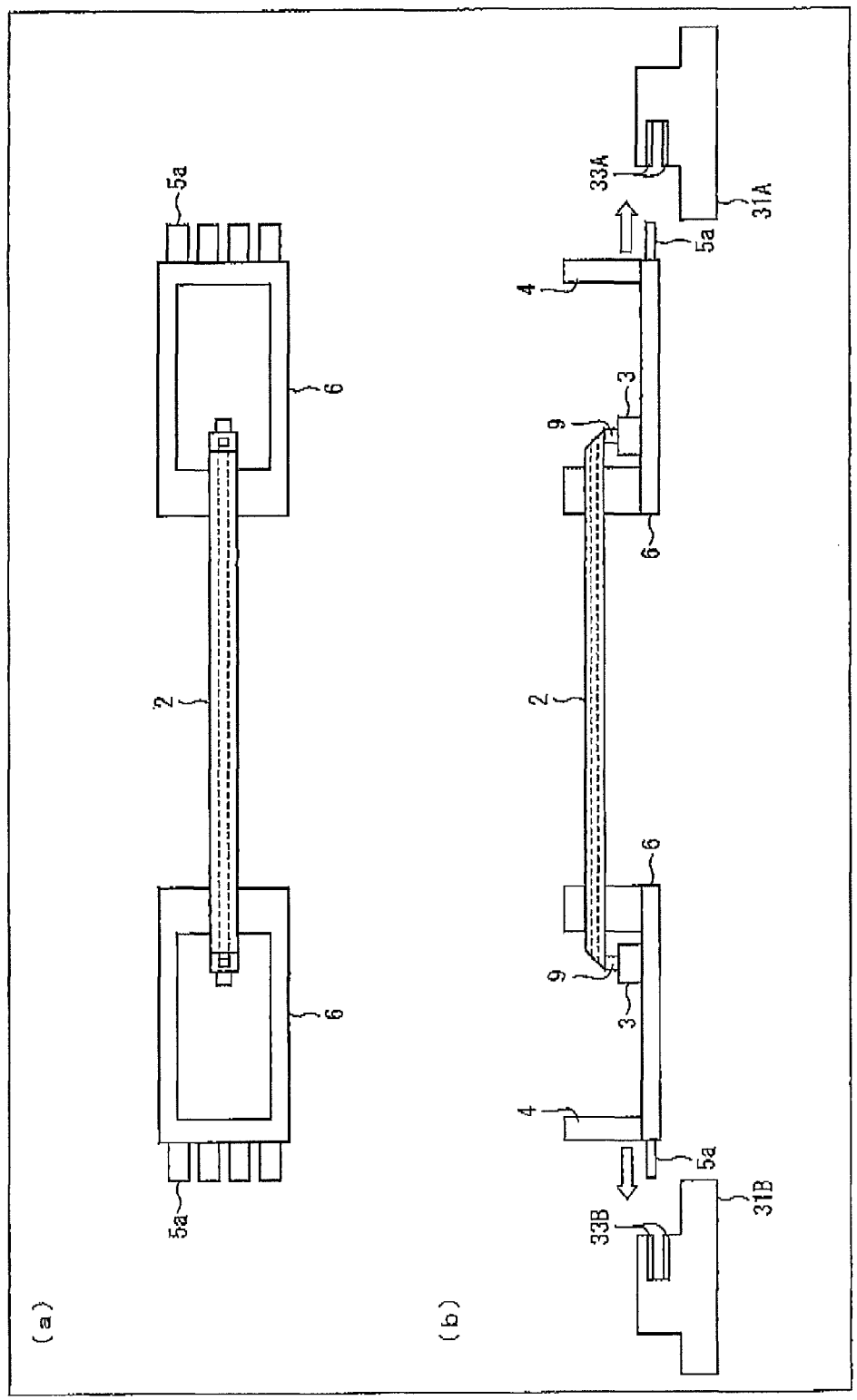
FIG. 13(a) is a plan view showing a schematic configuration of the light transmission module in which the electrical connecting portion is arranged in a shape projecting out in a direction parallel to the surface of the substrate.
FIG. 13(b) is a side cross-sectional view thereof.

The electrical connecting portion 5a may be arranged in a shape projecting out in a direction parallel to the surface of the substrate 7. This configuration is shown in FIGS. 13(a) and 13(b). According to such configuration, the external wiring substrates 31A and 31B, and the light transmission module 1 may be electrically connected by moving them close in a direction parallel to the substrate surface thereof, and may be disconnected by moving them apart in the opposite direction.

Figure 14:
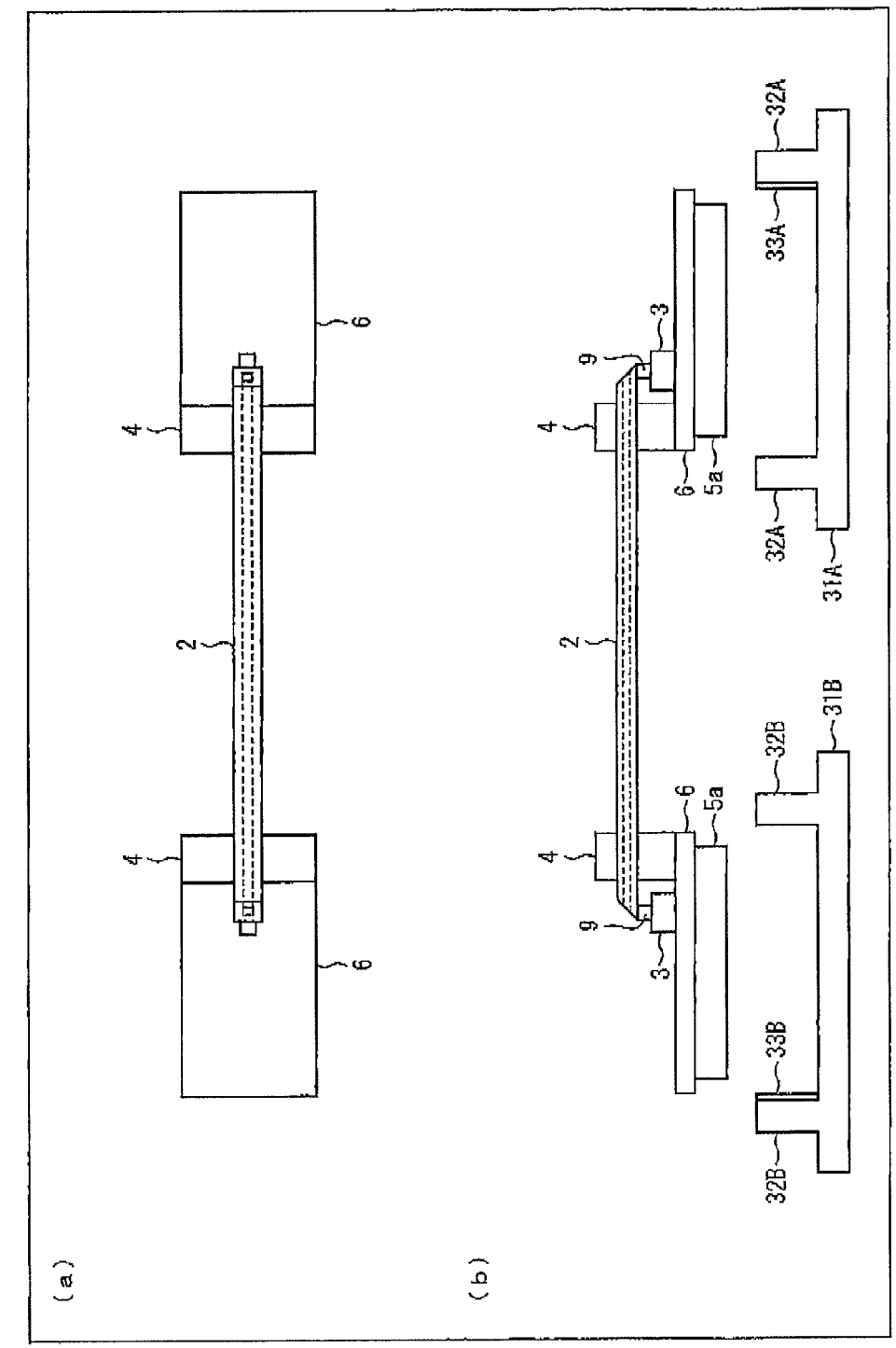
FIG. 14(a) is a plan view showing a schematic configuration of the light transmission module in which the electrical connecting portion serving as the electrical connector is arranged on a surface on the side opposite to the light emitting and receiving element in the substrate.
FIG. 14(b) is a side cross-sectional view thereof.

Furthermore, in the configuration shown in FIGS. 13(a) and 13(b), the electrical connecting portion 5a may be an electrical connector arranged on the surface on the side opposite to the light emitting and receiving element 3 in the substrate 6. This configuration is shown in FIGS. 14(a) and 14(b). According to such configuration, the light transmission module 1 is moved close to the external wiring substrates 31A and 31B in the direction perpendicular to the substrate surface to be electrically connected thereto, and moved apart in the opposite direction to be disconnected. In the configuration shown in FIGS. 14(a) and 14(b), the height compensation member 4 may include side walls that surround the light emitting and receiving element 3. In such configuration, the light emitting and receiving element 3 is arranged in an opening formed by the side walls of the height compensation member 4. The sealing resin may be injected to the opening formed by the side walls of the height compensation member 4.

Application Example

The light transmission module 1 of the present embodiment can be applied to the following application examples.

First, as a first application example, use can be made at the hinge portion in a foldable electronic device such as a foldable mobile phone, a foldable PHS (Personal Handy-phone System), a foldable PDA (Personal Digital Assistant), and a foldable notebook computer.

Figure 15:
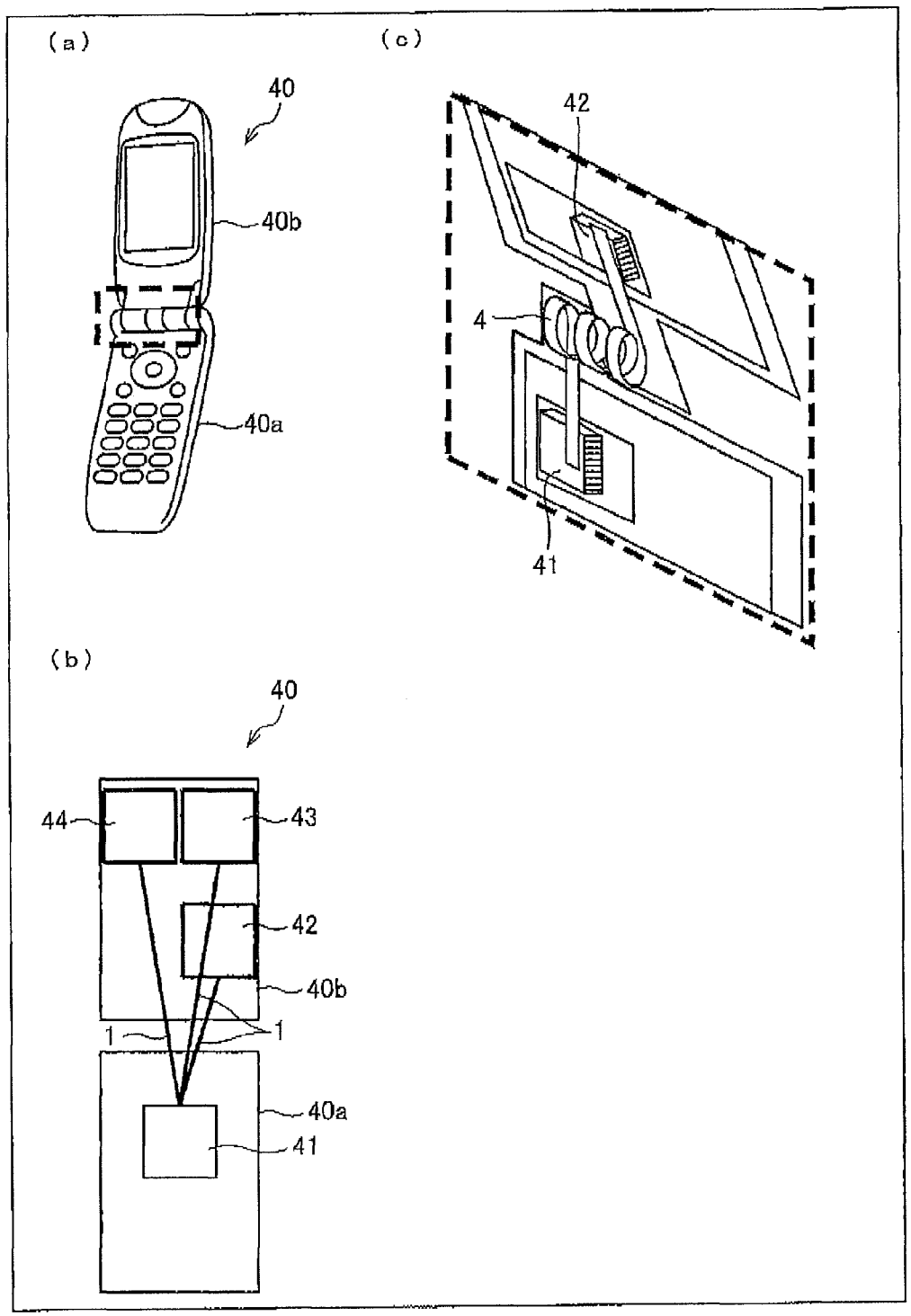
FIG. 15(a) is a perspective view showing an outer appearance of a foldable mobile phone including the light transmission path according to the present embodiment.
FIG. 15(b) is a block diagram of a portion where the light transmission path is applied in the foldable mobile phone shown in FIG. 15(a)
FIG. 15(c) is a perspective plan view of the hinge portion in the foldable mobile phone shown in FIG. 15(a).

FIGS. 15(a) to 15(c) show an example in which the light guide 10 is applied to a foldable mobile phone 40. FIG. 15(a) is a perspective view showing an outer appearance of the foldable mobile phone 40 incorporating the light guide 10.

FIG. 15(b) is a block diagram of a portion where the light guide 10 is applied in the foldable mobile phone 40 shown in FIG. 15(a). As shown in the figure, a control unit 41 arranged on a body 40a side in the foldable mobile phone 40, an external memory 42, a camera (digital camera) 43, and a display unit (liquid crystal display) 44 arranged on a lid (drive portion) 40b side rotatably arranged at one end of the body with the hinge portion as a shaft are connected by the light transmission path 4.

FIG. 15(c) is an exploded plan view of the hinge portion (portion surrounded with a broken line) in FIG. 15(a). As shown in the figure, the light transmission path 4 is wrapped around a supporting rod at the hinge portion and bent to thereby connect the control unit arranged on the body side, and the external memory 42, the camera 43, and the display unit 44 arranged on the lid side.

High speed and large capacity communication can be realized in a limited space by applying the light guide 10 to the foldable electronic device. Therefore, it is particularly suitable in devices where high speed and large capacity data communication is necessary and miniaturization is demanded such as the foldable liquid crystal display device.

As a second application example, the light guide 10 is applied to a device having a drive portion such as a printer head in a printing device (electronic device) and a reading unit in a hard disc recording and reproducing device.

Figure 16:
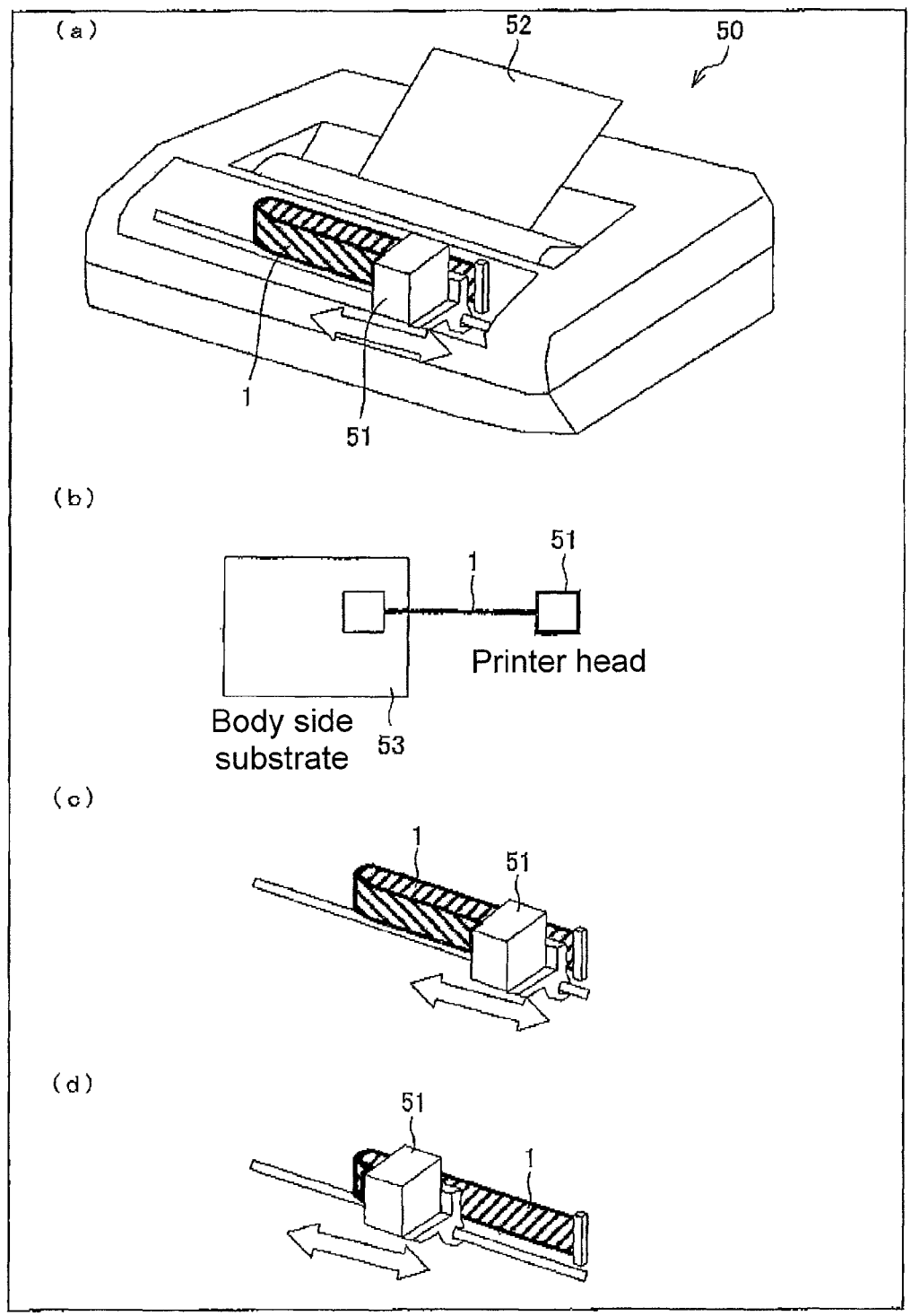
FIG. 16(a) is a perspective view showing an outer appearance of a printing device including the light transmission path according to the present embodiment.
FIG. 16(b) is a block diagram showing the main parts of the printing device shown in FIG. 16(a), and FIGS. 16(c) and 16(d) are perspective views showing a curved state of the light transmission path when the printer head is moved (driven) in the printing device.

FIGS. 16(a) to 16(c) show an example in which the light guide 10 is applied to a printing device 50. FIG. 16(a) is a perspective view showing an outer appearance of the printing device 50. As shown in the figure, the printing device 50 includes a printer head 51 for performing printing on a paper 52 while moving in a width direction of a paper 52, where one end of the light guide 10 is connected to the printer head 51.

FIG. 16(b) is a block diagram of a portion where the light guide 10 is applied in the printing device 50. As shown in the figure, one end of the light guide 10 is connected to the printer head 51, and the other end is connected to a body side substrate in the printing device 50. The body side substrate includes control means etc. for controlling the operation of each unit of the printing device 50, and the like.

FIGS. 16(c) and 16(d) are perspective views showing a curved state of the light guide 10 when the printer head 51 is moved (driven) in the printing device 50. As shown in the figure, when the light guide 10 is applied to the drive portion such as the printer head 51, the curved state of the light transmission path 4 changes by the drive of the printer head 51 and each position of the light guide 10 repeatedly curves.

Therefore, the light transmission module 1 according to the present embodiment is suited for such drive portion. High speed and large capacity communication using the drive portion can be realized by applying the light transmission module 1 to such drive portion.

Figure 17:
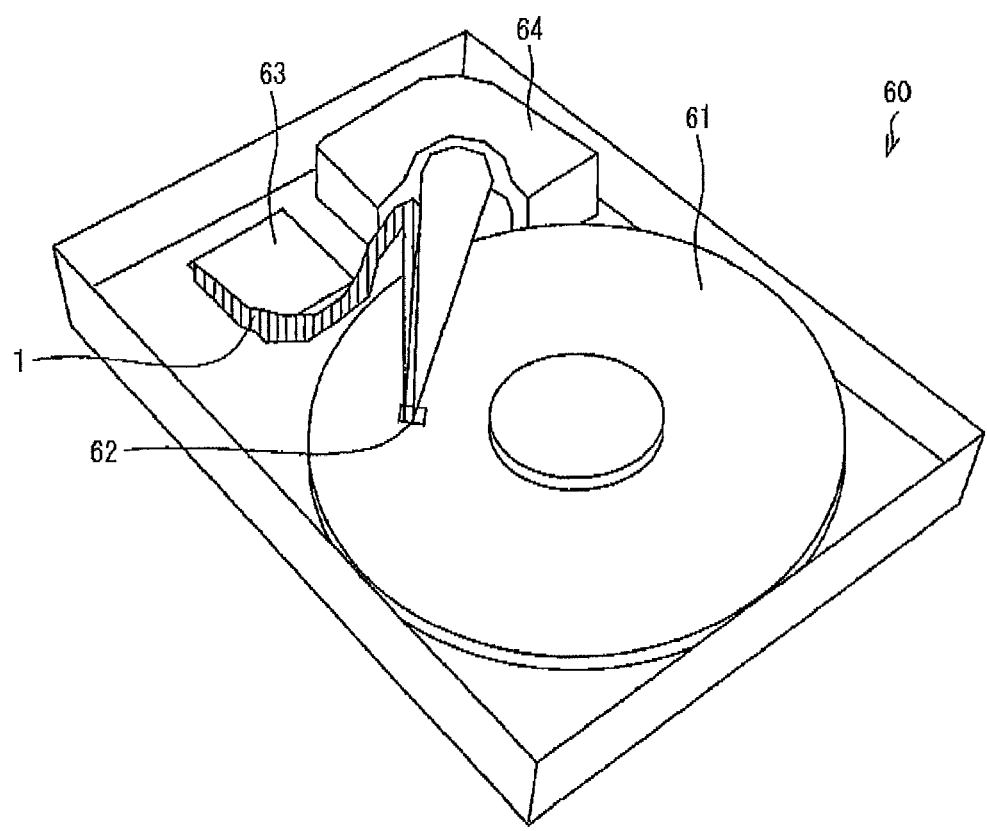
FIG. 17 is a perspective view showing an outer appearance of a hard disc recording and reproducing device including the light transmission path according to the present embodiment.

FIG. 17 shows an example in which the light guide 10 is applied to a hard disc recording and reproducing device 60.

As shown in the figure, the hard disc recording and reproducing device 60 includes a disc (hard disc) 61, a head (read/write head) 62, a substrate introducing portion 63, a drive portion (drive motor) 64, and the light guide 10.

The drive portion 64 drives the head 62 along a radial direction of the disc 61. The head 62 reads the information recorded on the disc 61 and writes information on the disc 61. The head 62 is connected to the substrate introducing portion 63 by way of the light guide 10, and propagates the information read from the disc 61 to the substrate introducing portion 63 as an optical signal and receives the optical signal of the information to write to the disc 61 propagated from the substrate introducing portion 63.

Therefore, high speed and large capacity communication can be realized by applying the light guide 10 to the drive portion such as the head 62 in the hard disc recording and reproducing device 60.

Therefore, the light transmission module of the present invention has a configuration in which the substrate includes a wiring exposed surface where the electrical wiring is exposed, the electrical connecting member is configured by a solidified object of liquid conductive material arranged to contact the electrical wiring exposed on the wiring exposed surface and the electrode pad, and the projection projecting out with respect to the light emitting and receiving surface is arranged between the electrode pad and the light emitting and receiving point.

Furthermore, the manufacturing method of the light transmission module of the present invention includes an electrical connecting step of applying the liquid conductive material so as to contact the electrical wiring and the electrode pad, and a projection forming step of forming the projection projecting out with respect to the light emitting and receiving surface in the optical element between the light emitting and receiving point and the electrode pad.

Thus, miniaturization and lower height are achieved, and interference of the liquid conductive material with the light emitting and receiving point can be prevented.

Furthermore, the electronic device of the present invention has a configuration in which the light transmission module further includes electrical connecting means, electrically connected to the electrical wiring, for electrically connecting with the external wiring, where the electrical connecting means at both ends of the light transmission path are respectively connected to different device substrates in the electronic device.

Therefore, optical data transmission between the device substrates in the electronic device can be carried out. Furthermore, the electronic device can be miniaturized since the light transmission module is mounted to carry out data transmission.

In the light transmission module of the present invention, the height from the mounting surface of the optical element to the wiring exposed surface is preferably the same as the height from the mounting surface of the optical element to the forming surface of the electrode pad.

According to the above configuration, the height from the mounting surface of the optical element to the wiring exposed surface is the same as the height from the mounting surface of optical element to the forming surface of the electrode pad, and thus the high and low difference between the wiring exposed surface and the forming surface of the electrode pad is resolved, and breakage less likely occurs in the electrical connection by the solidified object of the liquid conductive material. Thus, according to the above configuration, the wiring exposed surface and the electrode pad can be stably electrically connected without breakage.

In the light transmission module of the present invention, the substrate includes a seat member for supporting the light transmission path, and the projection preferably supports the portion projecting out to the optical element side from the seat member in the light transmission path.

According to the above configuration, the distance between the light transmission path and the optical element is compensated by both the seat member and the projection. Thus, according to the above configuration, the variation in the spaced distance between the light emitting and receiving surface and the light transmission path, that is, the optical coupling distance can be reduced compared to the configuration of compensating the distance between the optical element and the light transmission path with only the seat member.

Furthermore, the spaced distance between the light emitting and receiving surface and the light transmission path stabilizes, and the variation in the optical coupling distance reduces with the structure in which the light transmission path and the projection contact.

In the light transmission module of the present invention, the light transmission path is preferably adhered to the projection with the adhesive.

According to the above configuration, the effect of reducing the variation in the optical coupling distance can be further enhanced by adhering the light transmission path to the projection with the adhesive. Furthermore, the portion projecting out to the optical element side from the seat member in the light transmission path can be prevented from being bent by its own weight. Furthermore, deformation of the light transmission path can be suppressed when vibration and impact are applied on the light transmission module.

In the light transmission module of the present invention, the seat member is preferably adhered to the substrate and the light transmission path with the adhesive.

When the seat member is adhered to the substrate and the light transmission path with the adhesive in the configuration in which the distance between the optical element and the light transmission path is compensated with only the seat member, the thickness of the adhering layer to be formed varies by the application amount of the adhesive and the variation of the load. The height of the projection is smaller than the heights of the seat member and the optical element. The processing variation of the projection is very small compared to the optical element and the seat member. Thus, the variation in the optical coupling distance between the light transmission path and the optical element can be reduced to very small even if the thickness of the adhering layer varies.

In the light transmission module of the present invention, the projection is preferably arranged to surround the periphery of the light emitting and receiving point in the direction parallel to the light emitting and receiving surface.

The contacting area of the light transmission path and the projection thus increases, and the holding effect of the light transmission path by the projection increases. The parallelism of the light transmission path and the light emitting and receiving surface of the optical element further increases, and lower power consumption can be realized.

The projection may be a horseshoe shape or a square shape.

In particular, if the projection has a square shape, the contacting area of the light transmission path and the projection further increases, and the holding effect of the light transmission path by the projection further increases. Consequently, the light transmission path is less likely to deform with respect to stress by the vibration, impact, and the like of the light transmission module, and the reliability of the optical coupling is further enhanced.

In the light transmission module of the present invention, the light transmission path is a film light guide in which at least one end face is diagonally processed, and the optical element optically couples with the light reflected by the relevant end face at the light emitting and receiving surface.

Furthermore, in the electronic device of the present invention, the optical element and the end face of the light transmission path in the light transmission module are preferably arranged in a housing of the electronic device.

Thus, the substrate for mounting the optical element and the end face of the light transmission path does not need to be arranged in the housing, whereby the electronic device can be further miniaturized.

In the electronic device of the present invention, the light transmission module is preferably arranged at the hinge portion in the electronic device including the hinge portion.

Thus, the noise that tends to occur at the bent portion can be reduced, whereby the data transmission between the device substrates in the electronic device with hinge can be reliably and efficiently performed. Furthermore, since the light transmission module is small and has flexibility, it can be mounted after incorporating the hinge in the electronic device with hinge, whereby an electronic device having high productivity can be realized.

The manufacturing method of the light transmission module of the present invention preferably includes a step of forming the wiring exposed surface where the electrical wiring is exposed on the substrate such that the height from the mounting surface of the optical element to the wiring exposed surface becomes the same as the height from the mounting surface of the optical element to the forming surface of the electrode pad before the electrical connecting step.

The manufacturing method of the light transmission module of the present invention is a manufacturing method of the light transmission module for manufacturing the light transmission module, the manufacturing method including an electrical connecting step of applying the liquid conductive material so as to contact the electrical wiring and the electrode pad, and a projection forming step of forming the projection projecting out with respect to the light emitting and receiving surface in the optical element between the light emitting and receiving point and the electrode pad, wherein the step of forming the wiring exposed surface, where the electrical wiring is exposed on the substrate such that the height from the mounting surface of the optical element to the wiring exposed surface becomes the same as the height from the mounting surface of the optical element to the forming surface of the electrode pad, is provided before the electrical connecting step.

The wiring exposed surface and the electrode pad can be stably electrically connected without breaking.

In the manufacturing method of the light transmission module of the present invention, the method preferably includes a light transmission path mounting step of mounting the light transmission path on the projection with the adhesive.

According to the above configuration, the adhesive is used to mount the light transmission to the projection. The effect of reducing the variation in the optical coupling distance can be further enhanced.

Specific embodiments or examples described in the section BEST MODE FOR CARRYING OUT THE INVENTION merely clarify the technical contents of the present invention and are not to be construed in a narrow sense limiting only to such specific examples, and embodiments obtained by appropriately combining technical means disclosed in different embodiments are encompassed in the technical scope of the invention within the spirit of the invention and the scope of the attached Claims.

INDUSTRIAL APPLICABILITY

The light transmission module according to the present invention is applicable to the optical communication path between various types of devices, and is also applicable to a flexible optical wiring serving as an in-device wiring mounted in a small and thin commercial-off-the-shelf device.

The invention claimed is:

1. A light transmission module comprising:
   a light transmission path for transmitting light;
   an optical element including a light emitting and receiving surface for optically coupling with the light transmitted by the light transmission path, and being formed with a light emitting and receiving point having a function of photoelectric conversion and an electrode pad on the light emitting and receiving surface;
   a substrate mounted with the optical element and an electrical wiring; and
   an electrical connecting member for electrically connecting the electrode pad and the electrical wiring; wherein
   the substrate includes a wiring exposed surface where the electrical wiring is exposed;
   the electrical connecting member is made of solidified object of a liquid conductive material arranged to contact the electrical wiring, which is exposed at the wiring exposed surface, and the electrode pad; and
   a projection projecting out with respect to the light emitting and receiving surface is arranged between the electrode pad and the light emitting and receiving point.

2. The light transmission module according to claim 1, wherein a height from a mounting surface of the optical element to the wiring exposed surface is the same as a height from the mounting surface of the optical element to a forming surface of the electrode pad.

3. The light transmission module according to claim 2, wherein
   the substrate includes a seat member for supporting the light transmission path; and
   the projection supports a portion projecting out towards the optical element side from the seat member in the light transmission path.

4. The light transmission module according to claim 3, wherein the light transmission path is adhered to the projection with an adhesive.

5. The light transmission module according to claim 3, wherein the seat member is adhered to the substrate and the light transmission path with an adhesive.

6. The light transmission module according to claim 2, wherein the projection is arranged to surround a periphery of the light emitting and receiving point in a direction parallel to the light emitting and receiving surface.

7. The light transmission module according to claim 6, wherein the projection has a horseshoe shape or a square shape.

8. The light transmission module according to claim 1, wherein
   the light transmission path is a film light guide in which at least one end face is diagonally processed; and
   the optical element optically couples with the light reflected by the end face at the light emitting and receiving surface.

9. An electronic device comprising the light transmission module according to claim 1, wherein
   the light transmission module further includes electrical connecting means, electrically connected with the electrical wiring, for electrically connecting with an external wiring; and
   the electrical connecting means at both ends of the light transmission path are respectively connected to a device substrate in the electronic device.

10. The electronic device according to claim 9, wherein the optical element and the end face of the light transmission path in the light transmission module are arranged in a housing of the electronic device.

11. The electronic device according to claim 9, wherein
    the electronic device includes a hinge portion; and
    the light transmission module is arranged at the hinge portion.

12. A manufacturing method of a light transmission module including,
    a light transmission path for transmitting light;
    an optical element including a light emitting and receiving surface for optically coupling with the light transmitted by the light transmission path, and being formed with a light emitting and receiving point having a function of photoelectric conversion and an electrode pad on the light emitting and receiving surface;
    a substrate mounted with the optical element and an electrical wiring; and
    an electrical connecting member for electrically connecting the electrode pad and the electrical wiring; the manufacturing method comprising:
    electrical connecting step of applying a liquid conductive material so as to contact the electrical wiring and the electrode pad; and
    projection forming step of forming a projection projecting out with respect to the light emitting and receiving surface of the optical element between the light emitting and receiving point and the electrode pad.

13. A manufacturing method for manufacturing the light transmission module according to claim 1, comprising:
    electrical connecting step of applying a liquid conductive material so as to contact the electrical wiring and the electrode pad; and
    projection forming step of forming a projection projecting out with respect to the light emitting and receiving surface of the optical element between the light emitting and receiving point and the electrode pad, wherein
    a step of forming a wiring exposed surface, where the electrical wiring is exposed, on the substrate so that a height from a mounting surface of the optical element to the wiring exposed surface is the same as a height from the mounting surface of the optical element to a forming surface of the electrode pad is provided before the electrical connecting step.

14. The manufacturing method of the light transmission module according to claim 12, wherein a step of forming a wiring exposed surface, where the electrical wiring is exposed, on the substrate so that a height from a mounting surface of the optical element to the wiring exposed surface is the same as a height from the mounting surface of the optical element to a forming surface of the electrode pad is provided before the electrical connecting step.

15. The manufacturing method of the light transmission module according to claim 13, further comprising light transmission path mounting step of mounting the light transmission path on the projection with an adhesive.

16. The manufacturing method of the light transmission module according to claim 14, further comprising light transmission path mounting step of mounting the light transmission path on the projection with an adhesive.

* * * * *